US011715789B2

(12) United States Patent
Takahashi et al.

(10) Patent No.: US 11,715,789 B2
(45) Date of Patent: Aug. 1, 2023

(54) SEMICONDUCTOR DEVICE

(71) Applicant: Mitsubishi Electric Corporation, Tokyo (JP)

(72) Inventors: Tetsuo Takahashi, Tokyo (JP); Hidenori Fujii, Tokyo (JP); Shigeto Honda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 191 days.

(21) Appl. No.: 17/373,742

(22) Filed: Jul. 12, 2021

(65) Prior Publication Data

US 2022/0109063 A1 Apr. 7, 2022

(30) Foreign Application Priority Data

Oct. 1, 2020 (JP) .................................. 2020-167211

(51) Int. Cl.
*H01L 29/739* (2006.01)
*H01L 29/861* (2006.01)

(52) U.S. Cl.
CPC ........ *H01L 29/7397* (2013.01); *H01L 29/861* (2013.01)

(58) Field of Classification Search
CPC .......................... H01L 29/7397; H01L 29/861
USPC ...................................................... 257/140
See application file for complete search history.

(56) References Cited

U.S. PATENT DOCUMENTS

| 10,763,345 | B2* | 9/2020 | Murakawa | .......... H01L 27/0761 |
| 2016/0307993 | A1 | 10/2016 | Kuribayashi et al. | |
| 2019/0287961 | A1* | 9/2019 | Naito | .................. H01L 27/0727 |
| 2022/0109044 | A1* | 4/2022 | Takahashi | .......... H01L 29/0619 |

FOREIGN PATENT DOCUMENTS

| JP | H07-312427 A | 11/1995 |
| JP | 2012-204541 A | 10/2012 |
| JP | 2017-157673 A | 9/2017 |
| WO | 2016/010097 A1 | 1/2016 |

OTHER PUBLICATIONS

Takahashi, Hideki et al.; "1200V Reverse Conducting IGBT"; Proceedings of 2004 International Symposium on Power Semiconductor Devices & ICs, Kitakyushu; pp. 133-136.

* cited by examiner

*Primary Examiner* — Igwe U Anya
(74) *Attorney, Agent, or Firm* — Studebaker & Brackett PC

(57) ABSTRACT

A transistor and a diode are formed on a common semiconductor substrate; the semiconductor substrate has a transistor region and an outer peripheral region surrounding it; the transistor region is divided into a plurality of channel regions and a plurality of non-channel regions by a plurality of gate electrodes each having a stripe shape; each of the plurality of non-channel regions has a first semiconductor layer, a second semiconductor layer, a third semiconductor layer, a fifth semiconductor layer, a first electrode, and a second electrode; the third semiconductor layer and the fifth semiconductor layer are electrically connected to the second electrode via a contact hole; and the fifth semiconductor layer is selectively provided not to be in contact with an impurity layer of a first conductivity type that is provided in the outer peripheral region and defines a boundary with a cell region.

11 Claims, 32 Drawing Sheets

F I G. 1 3
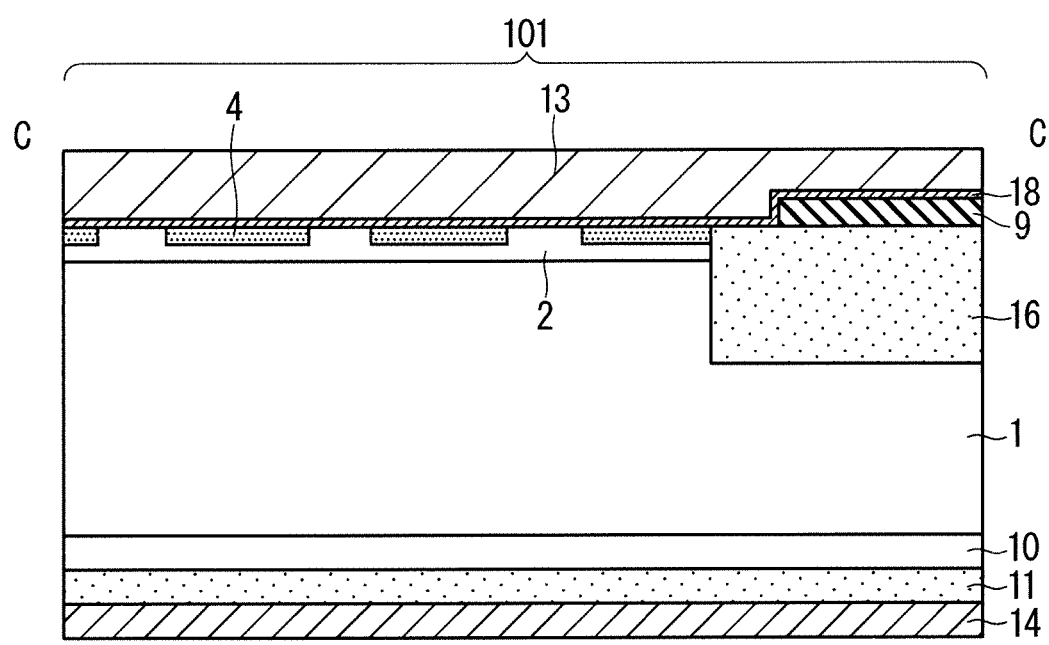

F I G. 2 8
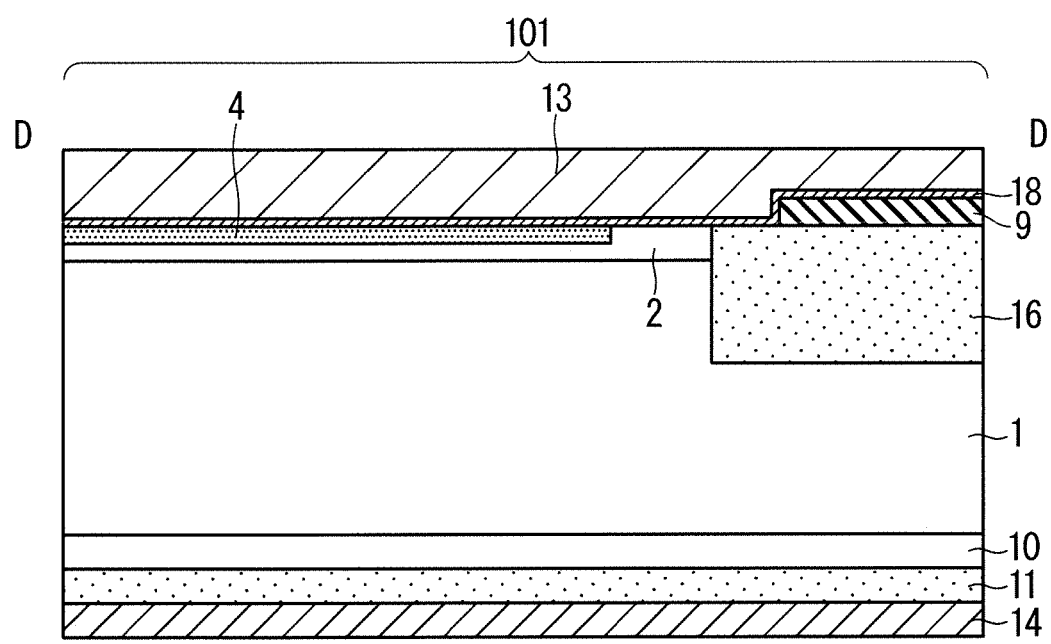

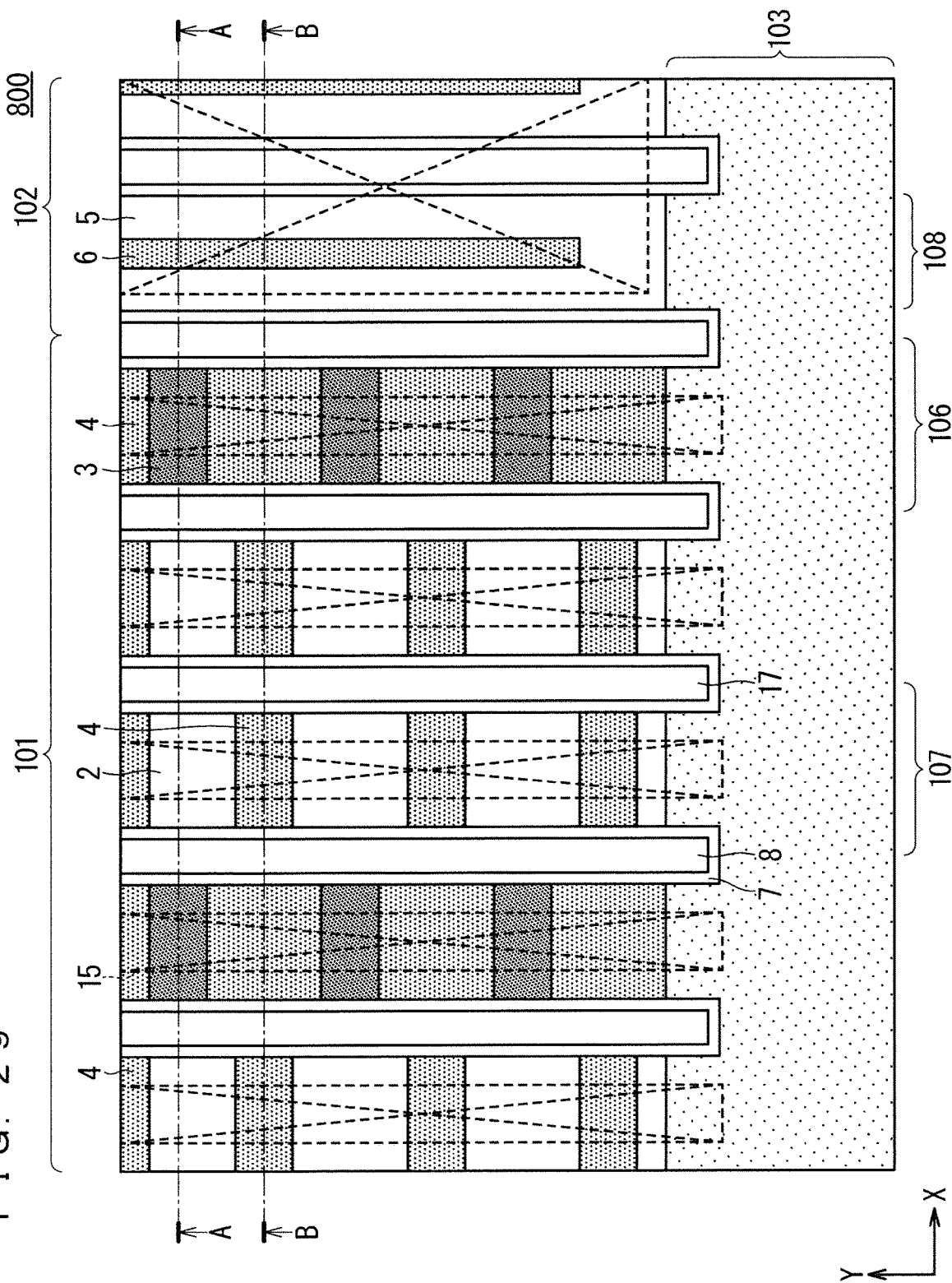

SEMICONDUCTOR DEVICE

BACKGROUND OF THE INVENTION

Field of the Invention

The present disclosure relates to a semiconductor device, and relates to a semiconductor device having a reduced recovery loss.

Description of the Background Art

In general, power devices are required to meet various requirements such as withstand voltage holding capacity and guarantee of a safe operating area so that the device does not break during its operation. One of the requirements is low loss. Reducing loss in power devices has the effects of reducing the size and weight of the device, and in a broad sense, it has an effect that leads to the conservation of the global environment by reducing energy consumption. It is further required to realize a power device that achieves these effects at the lowest possible cost.

As means for meeting the above requirements, an RC-IGBT (Reverse-Conducting Insulated Gate Bipolar Transistor) that achieves the characteristics of an IGBT and an FWD (Free Wheeling Diode) by one structure has been proposed, as disclosed, for example, in Proceedings of International symposium on Power Semiconductor devices 2004 pp. 133-136.

This RC-IGBT has some technical problems, one of which is that the recovery loss during the operation of the diode is large. In the RC-IGBT, a p-n junction, formed by an anode part (p-type anode) and p$^+$-type contact of a diode part and an n$^-$-type drift layer, becomes a forward bias during the operation of the FWD, and conductivity modulation occurs by holes flowing into the n$^-$-type drift layer, whereby forward voltage drop can be reduced. However, when the concentration of p-type impurities in an anode region is high, the existence of a large amount of excess carriers makes it difficult for the carriers inside the device to be discharged. Therefore, there has been a problem that the recovery loss is increased.

Japanese Patent Application Laid-Open No. 2017-157673 discloses some configurations that solve these problems. In Japanese Patent Application Laid-Open No. 2017-157673, an IGBT region has a trench gate and is divided into a channel region where a channel is formed and a non-channel region where a channel is not formed, and in the non-channel region, p-type base regions and p$^+$-type contacts in an IGBT part are alternately formed.

By reducing the average concentration of p-type impurities in the non-channel region in this way, the recovery loss during the operation of the FWD is reduced.

In the technology disclosed in Japanese Patent Application Laid-Open No. 2017-157673, an improvement in the recovery loss is insufficient, such as the fact that no countermeasure is taken against the inflow of holes from an outer peripheral region.

SUMMARY

An object of the present disclosure is to provide a semiconductor device in which the recovery loss during the operation of an FWD is further reduced.

A semiconductor device according to the present disclosure is a semiconductor device in which a transistor and a diode are formed on a common semiconductor substrate, in which: the semiconductor substrate has a transistor region where the transistor is formed, a diode region where the diode is formed, and an outer peripheral region surrounding a cell region including the transistor region and the diode region; the transistor region is divided into a plurality of channel regions in each of which a channel is formed and a plurality of non-channel regions in each of which the channel is not formed, by a plurality of gate electrodes each having a stripe shape; each of the plurality of channel regions has a first semiconductor layer of a first conductivity type provided on a second main surface side of the semiconductor substrate, a second semiconductor layer of a second conductivity type provided on the first semiconductor layer, a third semiconductor layer of the first conductivity type provided on a first main surface side of the semiconductor substrate with respect to the second semiconductor layer, a fourth semiconductor layer of the second conductivity type selectively provided on an upper layer part of the third semiconductor layer, a fifth semiconductor layer of the first conductivity type selectively provided such that a side surface of the fifth semiconductor layer is in contact with a side surface of the fourth semiconductor layer, a first electrode electrically connected to the first semiconductor layer, and a second electrode electrically connected to the fourth semiconductor layer and the fifth semiconductor layer; among the plurality of non-channel regions, at least one non-channel region has the first semiconductor layer, the second semiconductor layer, the third semiconductor layer, the fifth semiconductor layer, the first electrode, and the second electrode; the third semiconductor layer and the fifth semiconductor layer in the at least one non-channel region are electrically connected to the second electrode via a contact hole; and the fifth semiconductor layer in the at least one non-channel region is a first non-channel region selectively provided on the upper layer part of the third semiconductor layer so as not to be in contact with an impurity layer of the first conductivity type that is provided in the outer peripheral region and defines a boundary with the cell region.

According to the above semiconductor device, the third semiconductor layer and the fifth semiconductor layer in the at least one non-channel region are electrically connected to the second electrode via the contact hole, and the fifth semiconductor layer in the at least one non-channel region is selectively provided on the upper layer part of the third semiconductor layer so as not to be in contact with the impurity layer of the first conductivity type that is provided in the outer peripheral region and defines the boundary with the cell region, so that the recovery loss can be further reduced.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIGS. 11 to 13 are each a partial cross-sectional view of the RC-IGBT according to the third preferred embodiment;

FIGS. 26 to 28 are each a partial cross-sectional view of the RC-IGBT according to the seventh preferred embodiment;

FIG. 29 is a partial plan view of an RC-IGBT according to an eighth preferred embodiment;

DESCRIPTION OF THE PREFERRED EMBODIMENTS

<Introduction>

Figure 1:
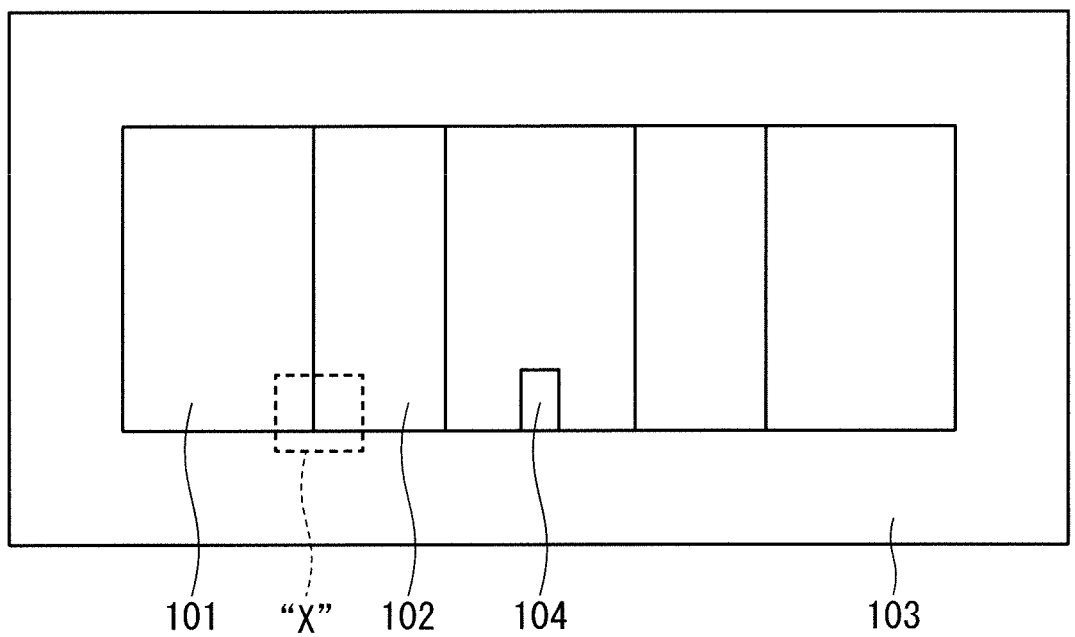
FIG. 1 is a plan view illustrating an entire chip of an RC-IGBT according to a first preferred embodiment.

In the following description, an n-type and a p-type indicate the conductivity types of a semiconductor. In the present disclosure, description will be made by describing a first conductivity type as the p-type and a second conductivity type as the n-type, but the first conductivity type may be described as the n-type and the second conductivity type as the p-type. In addition, it is indicated that an $n^-$-type has a lower concentration of impurities than the n-type and an $n^+$-type has a higher concentration of impurities than the n-type. Similarly, it is indicated that a $p^-$-type has a lower concentration of impurities than the p-type and a $p^+$-type has a higher concentration of impurities than the p-type.

In addition, the drawings are schematically shown, and the interrelationships between the sizes and positions of the images illustrated in different drawings are not necessarily illustrated exactly, and may be changed as appropriate. In addition, in the following description, similar constituents are designated by the same reference numerals, and their names and functions are set to be the same. Therefore, detailed description about them may be omitted.

In the following description, terms that mean specific positions and directions, such as "top", "bottom", "side", "front", and "back", may be used. These terms are used for convenience to facilitate understanding of the contents of preferred embodiments, and have nothing to do with the directions when the preferred embodiments are actually implemented.

<First Preferred Embodiment>
<Device Configuration>

Figure 2:
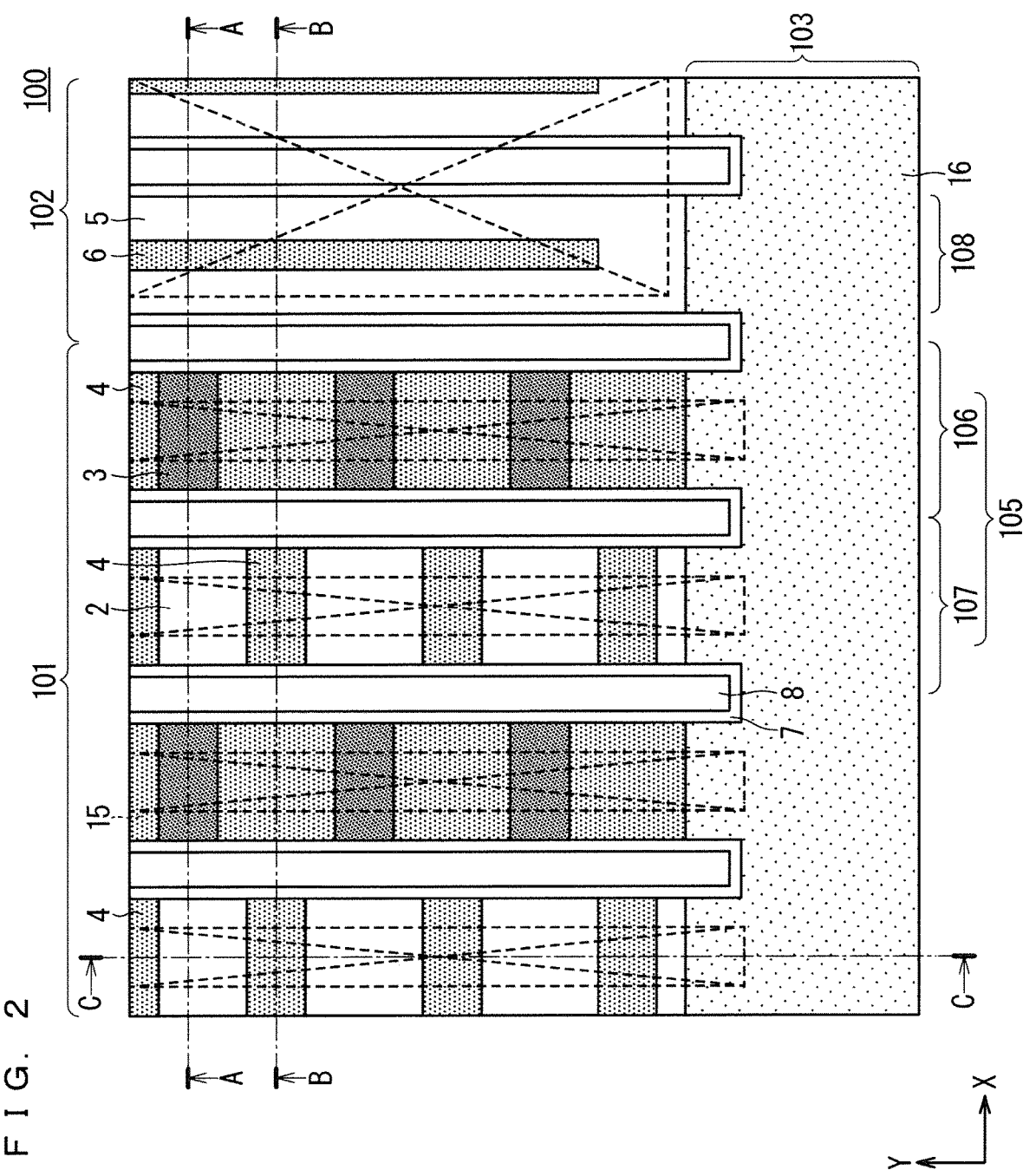
FIG. 2 is a partial plan view of the RC-IGBT according to the first preferred embodiment.

FIG. 1 is a plan view illustrating an entire chip of an RC-IGBT 100 according to a first preferred embodiment, and FIG. 2 is a plan view illustrating a region X surrounded by the dashed line in FIG. 1. The RC-IGBT 100 illustrated in FIG. 1 has IGBT regions 101 (transistor regions) and FWD regions 102 (diode regions) arranged side by side in a stripe shape, which is referred to as a "stripe type".

As illustrated in FIG. 1, an outer peripheral region 103 is provided to surround the IGBT regions 101 and the FWD regions 102, and one of the IGBT regions 101 is partially provided with a gate pad region 104. Also, in RC-ICBTs 200 to 800 of second to eighth preferred embodiments described later, the plan views each illustrating an entire chip are the same.

As illustrated in FIG. 2, the IGBT region 101 is divided into IGBT channel regions 106 in each of which a channel is formed and IGBT non-channel regions 107 (first non-channel regions) in each of which a channel is not formed, by a plurality of embedded gate electrodes 8 each having a trench structure and a stripe shape. The IGBT channel region 106 and the IGBT non-channel region 107 are collectively referred to as a unit cell region 105. The IGBT regions 101 and the FWD regions 102 are collectively referred to as a cell region.

The IGBT channel regions 106 and the IGBT non-channel regions 107 are alternately formed in an X direction (horizontal direction), which is the arrangement direction of the embedded gate electrodes 8, with the embedded gate electrodes 8 sandwiched between the regions. In each of the IGBT channel region 106 and the IGBT non-channel region 107, a contact hole 15 is provided.

In the IGBT channel region 106, $n^+$-type emitter layers 3 (fourth semiconductor layers) and $p^+$-type contact layers 4 (fifth semiconductor layers) are alternately formed in a Y direction (vertical direction) that is the extending direction of the embedded gate electrode 8.

In the IGBT non-channel region 107, p-type channel doped layers 2 (third semiconductor layer) and the $p^+$-type contact layers 4 are alternately formed in the Y direction. This is referred to as a first feature of the first preferred embodiment.

In the IGBT non-channel region 107, the p-type channel doped layer 2 is formed at the boundary with a p-type well layer 16 (impurity layer) in the outer peripheral region 103, and the p-type channel doped layer 2 is connected to the p-type well layer 16. This is referred to as a second feature of the first preferred embodiment.

The $p^+$-type contact layer 4 in the IGBT non-channel region 107 is provided such that an area ratio is smaller than an area ratio of the p-type channel doped layer 2. Here, the area ratio means an area ratio to the total area, in plan view, of the p-type channel doped layer 2 and the $p^+$-type contact layer 4. This is referred to as a third feature of the first preferred embodiment. However, the $p^+$-type contact layer 4 cannot be reduced to zero, so that it is desirable to set the area ratio of the $p^+$-type contact layer 4 to at least about 20%.

On the other hand, in the IGBT channel region 106, the $p^+$-type contact layer 4 is formed at the boundary with the p-type well layer 16 in the outer peripheral region 103, and the $p^+$-type contact layer 4 is connected to the p-type well layer 16. The $n^+$-type emitter layer 3 in the IGBT channel region 106 is provided such that the area ratio is smaller than that of the $p^+$-type contact layer 4.

In the FWD region 102, a p-type anode layer 5 is divided into a plurality of anode regions 108 by a plurality of the embedded gate electrodes 8, and in each of the anode regions 108, a p+-type contact layer 6 that extends in the Y direction and has a stripe shape is provided as illustrated in FIG. 2. The p+-type contact layer 6 is provided so as not to be in contact with the p-type well layer 16 in the outer peripheral region 103. The contact hole 15 is provided to straddle the plurality of anode regions 108.

Figure 3:
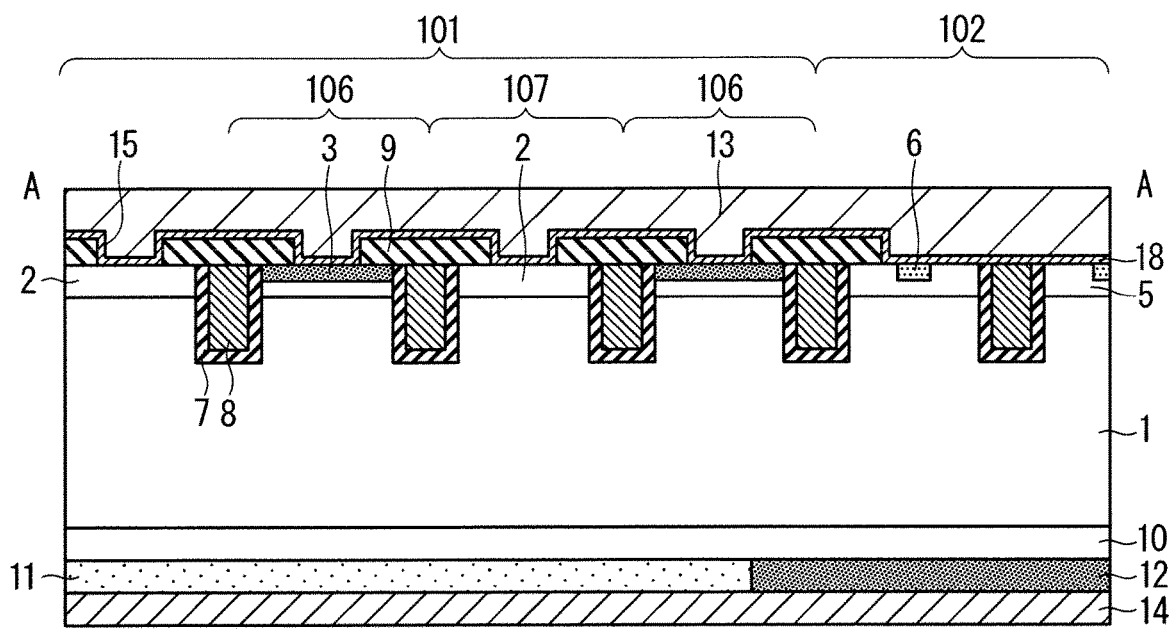
FIGS. 3 to 5 are each a partial cross-sectional view of the RC-IGBT according to the first preferred embodiment.
Figure 4:
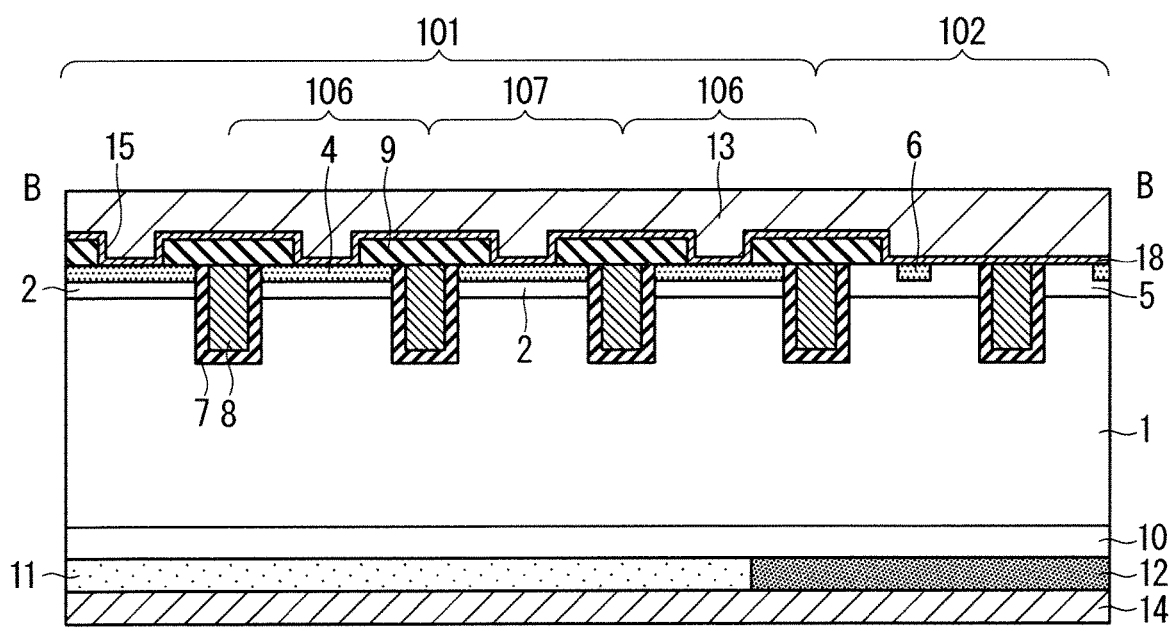
Figure 5:
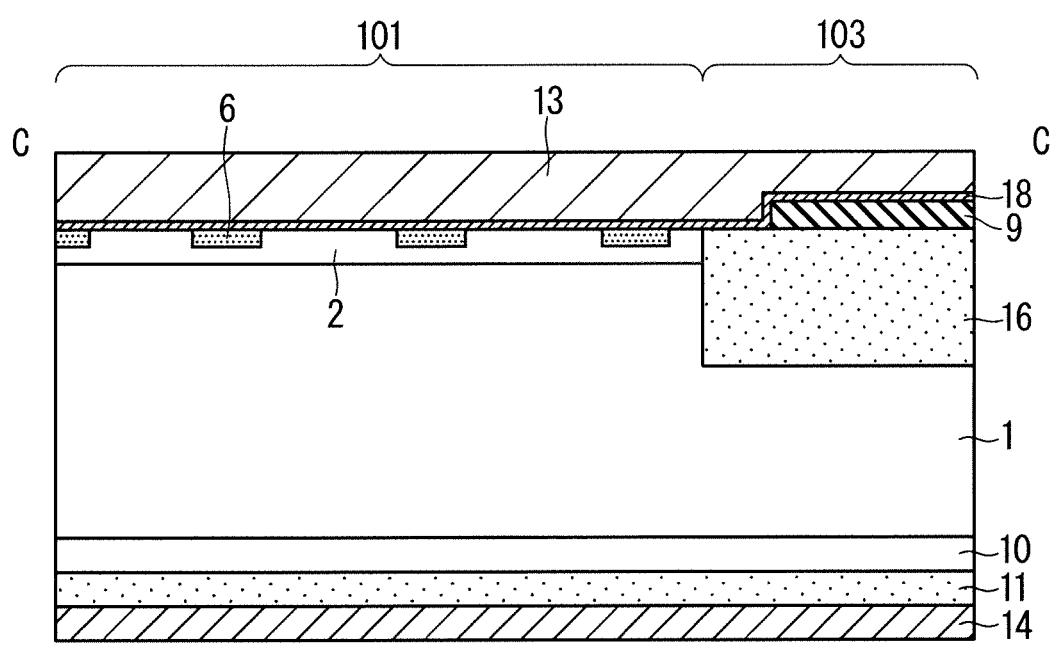

A cross-sectional view taken along the A-A line illustrated in FIG. 2 and viewed from the direction indicated by the arrows is illustrated in FIG. 3, a cross-sectional view taken along the B-B line and viewed from the direction indicated by the arrows is illustrated in FIG. 4, and a cross-sectional view taken along the C-C line and viewed from the direction indicated by the arrows is illustrated in FIG. 5.

As illustrated in FIGS. 3 to 5, the RC-IGBT 100 has an n−-type drift layer 1 (second semiconductor layer) made of a semiconductor substrate such as a silicon (Si) substrate. The n−-type drift layer 1 has, for example, arsenic (As) or phosphorus (P) as n-type impurities, and the concentration of the n-type impurities is $1.0 \times 10^{12}/cm^3$ to $1.0 \times 10^{15}/cm^3$.

In the IGBT region 101, the semiconductor substrate ranges from the n+-type emitter layer 3 and the p+-type contact layer 4 to a p-type collector layer 11 (first semiconductor layer), and in the FWD region 102, the semiconductor substrate ranges from the p+-type contact layer 6 to an n+-type cathode layer 12.

In FIGS. 3 to 5, the top edges of the paper of the n+-type emitter layer 3 and the p+-type contact layer 4 in the IGBT region 101 are called a first main surface of the semiconductor substrate, and the bottom edge of the paper of the p-type collector layer 11 is called a second main surface of the semiconductor substrate. In FIGS. 3 to 5, the top edge of the paper of the p+-type contact Layer 6 in the FWD region 102 is called the first main surface of the semiconductor substrate, and the bottom edge of the paper of the n+-type cathode layer 12 is called the second main surface of the semiconductor substrate. The first main surface in the FWD region 102 and the first main surface in the IGBT region 101 are the same surface, and the second main surface in the FWD region 102 and the second main surface in the IGBT region 101 are the same surface.

In the IGBT region 101, the p-type channel doped layer 2 is provided on the first main surface side of the n−-type drift layer 1, and in the FWD region 102, the p-type anode layer 5 is provided on the first main surface side of the n−-type drift layer 1, as illustrated in FIGS. 3 to 5. The p-type channel doped layer 2 is a semiconductor layer having, for example, boron (B) or aluminum (Al) as p-type impurities, and the concentration of the p-type impurities is $1.0 \times 10^{12}/cm^3$ to $1.0 \times 10^{19}/cm^3$.

On the first main surface side of the p-type channel doped layer 2, the n+-type emitter layer 3 is provided in contact with a gate insulating film 7 of the embedded gate electrode 8 in FIG. 3, and the p±-type contact layer 4 is provided in FIG. 4. The n+-type emitter layer 3 and the p+-type contact layer 4 constitute the first main surface of the semiconductor substrate.

The n+-type emitter layer 3 is a semiconductor layer having, for example, arsenic (As) or phosphorus (P) as n-type impurities, and the concentration of the n-type impurities is $1.0 \times 10^{17}/cm^3$ to $1.0 \times 10^{20}/cm^3$.

The p+-type contact layer 4 is a semiconductor layer having, for example, boron (B) or aluminum (Al) as p-type impurities, and the concentration of the p-type impurities is $1.0 \times 10^{15}/cm^3$ to $1.0 \times 10^{20}/cm^3$.

In the RC-IGBT 100, an n-type buffer layer 10 having a higher concentration of n-type impurities than the n−-type drift layer 1 is provided on the second main surface side of the n−-type drift layer 1, as illustrated in FIGS. 3 to 5. The n-type buffer layer 10 is provided to suppress, while the RC-IGBT 100 is turned off, a depletion layer, extending from the p-type channel doped layer 2 toward the second main surface, from punching through. The n-type buffer layer 10 may be formed by implanting, for example, phosphorus (P) or protons (H+), or by implanting both phosphorus (P) and protons (H+). The concentration of n-type impurities in the n-type buffer layer 10 is $1.0 \times 10^{12}/cm^3$ to $1.0 \times 10^{18}/cm^3$.

As illustrated in FIGS. 3 to 5, a collector electrode 14 (first electrode) is provided on the first main surfaces of the IGBT region 101 and the FWD region 102. The collector electrode 14 functions as a cathode electrode in the FWD region 102. On the collector electrode 14, the p-type collector layer 11 is provided in the IGBT region 101, and the n+-type cathode layer 12 is provided in the FWD region 102.

The p-type collector layer 11 is a semiconductor layer having, for example, boron (B) or aluminum (Al) as p-type impurities, and the concentration of the p-type impurities is $1.0 \times 10^{16}/cm^3$ to $1.0 \times 10^{20}/cm^3$.

The n+-type cathode layer 12 is a semiconductor layer having, for example, arsenic (As) or phosphorus (P) as n-type impurities, and the concentration of the n-type impurities is $1.0 \times 10^{16}/cm^3$ to $1.0 \times 10^{21}/cm^3$.

In the outer peripheral region 103, the p-type well layer 16 is provided on the first main surface side of the n−-type drift layer 1, as illustrated in FIG. 5. The p-type well layer 16 is provided to surround the IGBT region 101 and the FWD region 102, which has, for example, arsenic (As) or phosphorus (P) as n-type impurities and is in contact with the side surface of the p-type channel doped layer 2 in the IGBT region 101. The top edge of the paper of the p-type well layer 16 is the first main surface of the semiconductor substrate, and a cap insulating film 9 is provided on the p-type well layer 16.

Although not illustrated, an FLR (Field Limiting Ring) in which the cell region is surrounded by a p-type well layer (terminal well layer) or a VLD (Variation of Lateral Doping) in which the cell region is surrounded by a p-type well layer with a concentration gradient can be provided in the further outer periphery of the p-type well layer 16. The number of ring-shaped p-type well layers to be used in the FLR and the concentration distribution of the p-type well layer to be used in the VLD can be appropriately selected depending on the withstand voltage design of the RC-IGBT 100. In the IGBT region 101, a trench, which penetrates the p-type channel doped layer 2 from the first main surface of the semiconductor substrate to reach the n−-type drift layer 1, is formed, and the embedded gate electrode 8 is provided in the trench via the gate insulating film 7, as illustrated in FIGS. 3 and 4. The gate insulating film 7 and the embedded gate electrode 8 are covered with a cap insulating film 9, so that it is configured such that the embedded gate electrode 8 is not connected to an emitter electrode 13 (second electrode). The embedded gate electrode 8 in the IGBT region 101 is electrically connected to the gate pad region 104 via a gate wiring (not illustrated) formed inside the IGBT region 101, so that it functions as an active trench gate.

Also, in the FWD region 102, a trench, which penetrates the p-type channel doped layer 2 from the first main surface of the semiconductor substrate to reach the n−-type drift layer 1, is formed, and the embedded gate electrode 8 is provided in the trench via the gate insulating film 7, as illustrated in FIGS. 3 and 4. The gate insulating film 7 and the embedded gate electrode 8 in the FWD region 102 are connected to the emitter electrode 13, so that the embedded gate electrode 8 functions as a dummy trench gate.

As illustrated in FIGS. 3 to 5, a barrier metal 18 is formed on a region of the first main surface of the semiconductor substrate, where the cap insulating film 9 is not provided, and on the cap insulating film 9. The barrier metal 18 may be a conductor containing, for example, titanium (Ti), may be, for example, titanium nitride, or may be TiSi in which titanium and Si are alloyed. As illustrated in FIG. 3, the barrier metal 18 is in ohmic contact with the $n^+$-type emitter layer 3, the $p^+$-type contact layer 6, and the embedded gate electrode 8 in the FWD region 102, so that it is electrically connected to the $n^+$-type emitter layer 3, the $p^+$-type contact layer 6, and the embedded gate electrode 8 in the FWD region 102. The emitter electrode 13 is provided on the barrier metal 18. The emitter electrode 13 may be formed of, for example, an aluminum alloy such as an aluminum silicon alloy (Al—Si based alloy), or may be an electrode made of multiple layers of metal films obtained by forming a plating film on the electrode formed of the aluminum alloy by electroless plating or electrolytic plating. The plating film formed by electroless plating or electrolytic plating may be, for example, a nickel (Ni) plating film.

The gate pad region 104 illustrated in FIG. 1 is connected to a gate wiring formed inside the IGBT region 101, and an oxide film is formed directly under the gate pad region 104, so that the gate pad region 104 and the emitter electrode 13 are electrically separated from each other. Directly under the oxide film, the $n^-$-type drift layer 1 may be located, or a p-type terminal well layer may be provided.

Regarding a manufacturing method of the RC-IGBT 100 of the first preferred embodiment described above, the RC-IGBT 100 can be manufactured by: using a general manufacturing technique of an IGBT; changing a mask pattern in a lithography process; and changing arranging patterns of impurity layers in the IGBT channel region 106 and the IGBT non-channel region 107. Therefore, detailed description thereof will be omitted.

<Operation>The operation of the cell region of the RC-IGBT 100 will be described. In the RC-IGBT 100, a diode structure is formed by the p-type anode layer 5, the $p^+$-type contact layer 6, the $n^-$-type drift layer 1, and the $n^+$-type cathode layer 12. While the operation of the FWD is turned on, a state is created in which in an off-state of the IGBT acting as its pair, a positive voltage is applied to the emitter electrode 13 with respect to the collector electrode 14. Holes flow in from the anode region composed of the p-type anode layer 5 and the $p^+$-type contact layer 6, and electrons flow in from the cathode region composed of the $n^+$-type cathode layer 12. Thereby, conductivity modulation occurs and the diode becomes conductive.

Next, when the IGBT acting as its pair is turned on, a state is created in which a negative voltage is applied to the emitter electrode 13 with respect to the collector electrode 14. The holes in the $n^-$-type drift layer 1 escape from the p-type anode layer 5 and the $p^+$-type contact layer 6 to the emitter electrode 13, and the electrons escape from the $n^+$-type cathode layer 12 to the collector electrode. However, a current continues to flow until when excess carriers near the anode region disappear and a p-n junction formed by the p-type anode layer 5, the $p^+$-type contact layer 6, and the $n^-$-type drift layer 1 becomes reverse biased.

Then, when the excess carriers near the anode region escape and the p-n junction formed by the p-type anode layer 5, the $p^+$-type contact layer 6, and the $n^-$-type drift layer 1 becomes reverse biased, a reverse recovery current begins to decrease. When the excess carriers in the n-type drift layer 1 are discharged, a recovery step is completed and a blocked state is created.

In the RC-IGBT 100, the IGBT region 101 is formed adjacent to the FWD region 102, and in the IGBT region 101, the p-type channel doped layer 2, the $p^+$-type contact layer 4, the $n^-$-type drift layer 1, and the $n^+$-type cathode layer 12 form a parasitic diode structure. Therefore, in the above operation, a current also flows from the IGBT region, which contributes to an increase in loss.

However, in the RC-IGBT 100, it is configured such that the IGBT non-channel region 107 in which the p-type channel doped layers 2 and the $p^+$-type contact layers 4 are alternately formed is provided, so that the average concentration of p-type impurities in the anode structure portion in the IGBT non-channel region 107 is reduced (first feature). Therefore, the holes flowing into the $n^-$-type drift layer 1 from the IGBT non-channel region 107 are reduced, which can reduce the recovery loss possibly occurring in the parasitic diode.

In the IGBT non-channel region 107, by connecting the contact hole 15 to both the p-type channel doped layer 2 and the $p^+$-type contact layer 4, the amount of the holes to be implanted from the anode region of the parasitic diode is reduced without a current concentrated on the $p^+$-type contact layer 4 having a high concentration of impurities. Thereby, the recovery loss can be reduced.

In the RC-IGBT 100, the p-type channel doped layer 2 and the $p^+$-type contact layer 4 in the IGBT region 101 are electrically connected to the emitter electrode 13 via the barrier metal 18. For the barrier metal, Ti or the like as an example is used in a Si semiconductor. The barrier metal is formed as follows: after a Ti film is formed on a Si substrate by a sputtering process or the like, the surface of the Si is silicidized by lamp annealing in a nitrogen ($N_2$) atmosphere, and TiN is formed. In the first preferred embodiment, a barrier metal that prevents the contacts in the IGBT region 101 from becoming Schottky contacts, for example, TiSi, is selected. Thereby, a structure is created in which the recovery loss during the operation of the diode can be reduced while maintaining the effect of preventing an increase in the leakage current at high temperature, especially in the leakage current during the operation of the IGBT.

In the IGBT non-channel region 107, the area of the $p^+$-type contact layer 4 having a high concentration of impurities is made relatively smaller than the area of the p-type channel doped layer 2 (third feature). Thereby, the average concentration of p-type impurities in the anode structure portion in the IGBT non-channel region 107 can be reduced, so that the recovery loss in the parasitic diode in the IGBT region 101 can be reduced.

Next, the operation of the outer peripheral region 103 of the RC-IGBT 100 will be described. The p-type well layer 16 having a relatively high concentration is formed in the outer peripheral region 103, and a parasitic diode structure is formed by the p-type well layer 16, the $n^-$-type drift layer 1, and the $n^+$-type cathode layer 12. Therefore, undesired diode loss may occur, similarly to the IGBT region 101.

However, in the RC-IGBT 100, a configuration is created in the IGBT non-channel region 107, in which the $p^+$-type contact layer 4 having a high concentration of impurities is not formed near the p-type well layer 16, but the p-type channel doped layer 2 having a relatively low concentration is connected to the p-type well layer 16 (second feature). Therefore, holes are suppressed from being implanted from the parasitic diode via the p-type well layer 16, so that the recovery loss in the parasitic diode can be reduced.

In the RC-IGBT 100, the IGBT channel regions 106 and the IGBT non-channel regions 107 are alternately arranged, and the arrangement ratios thereof becomes equal, so that a good current balance is obtained.

In the RC-IGBT 100 of the first preferred embodiment, the recovery loss in the parasitic diode formed in the IGBT region 101 can be reduced by the first feature, as described above. Further, the second feature can reduce the influence of the parasitic diode formed in the outer peripheral region 103, so that the recovery loss can be further reduced. By combining these first to third features, the recovery loss during the operations of the diodes in the entire device can be reduced. Furthermore, the operation of the parasitic diode in the IGBT region 101 can be reduced more effectively by the third feature.

<Second Preferred Embodiment>

Figure 6:
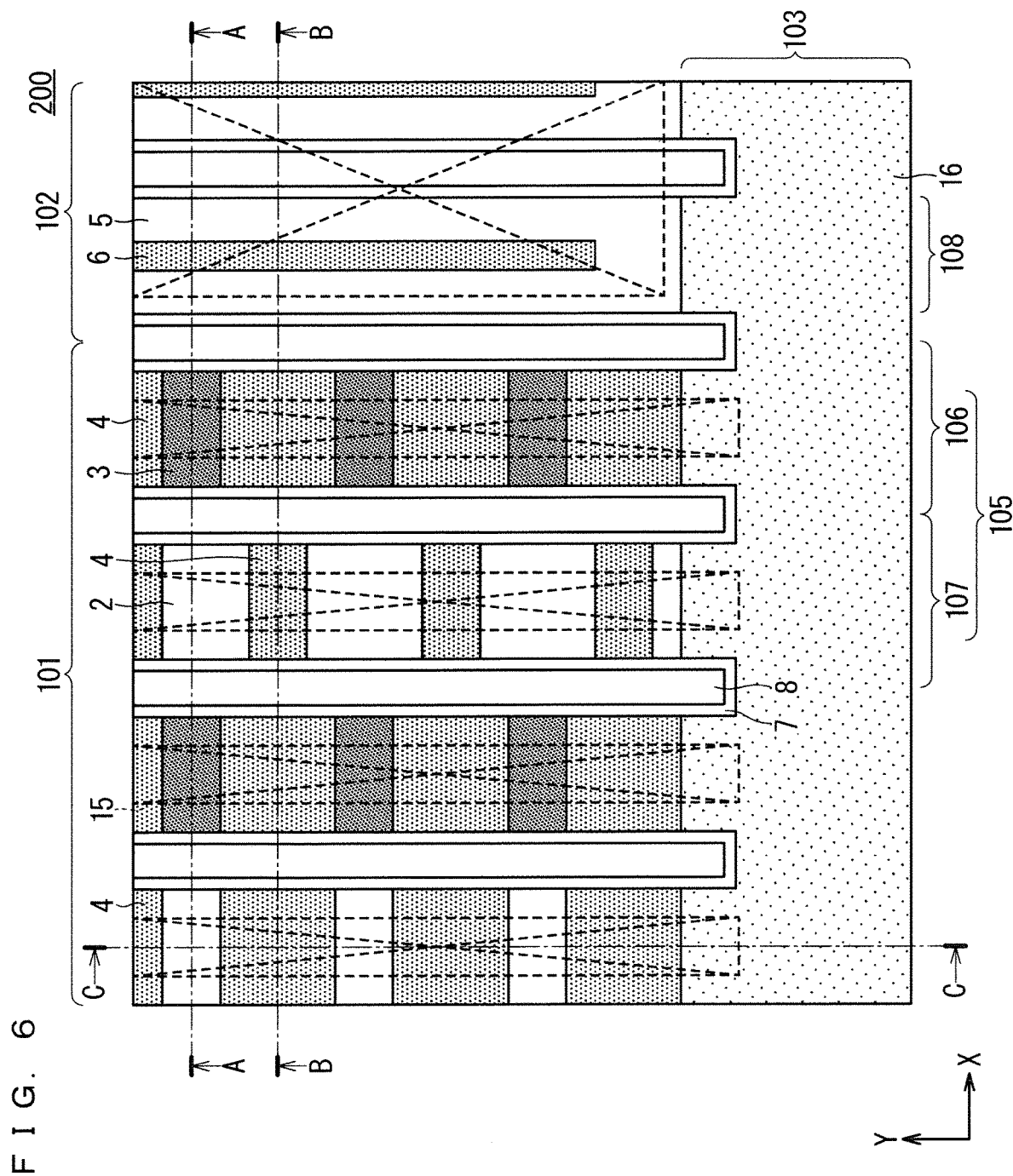
FIG. 6 is a partial plan view of an RC-IGBT according to a second preferred embodiment.
Figure 7:
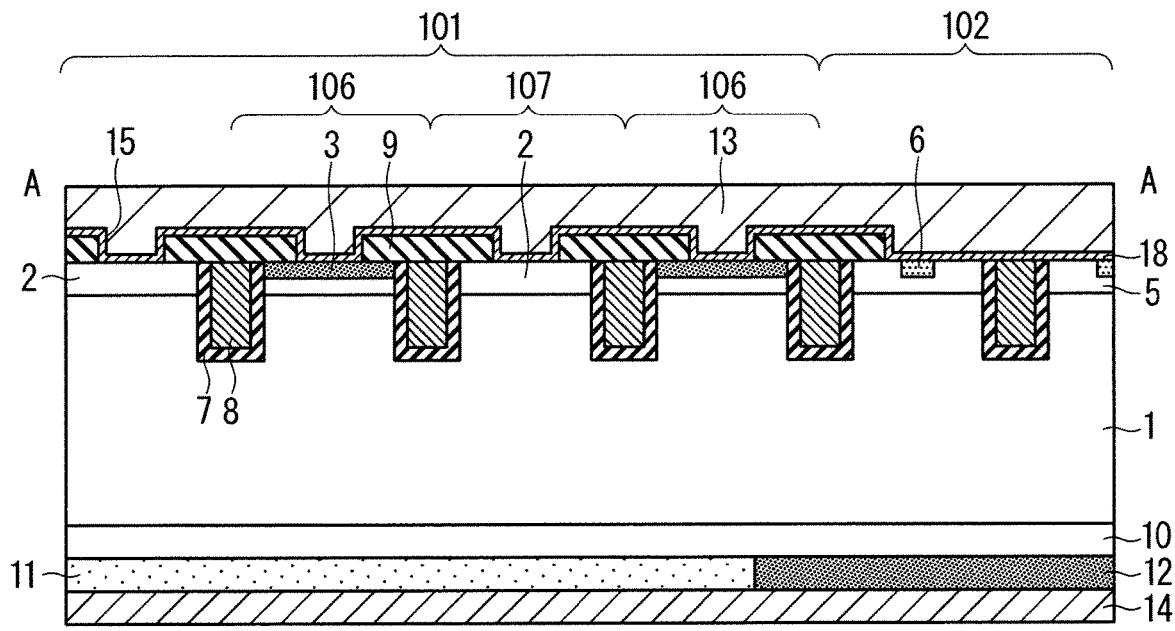
FIGS. 7 to 9 are each a partial cross-sectional view of the RC-IGBT according to the second preferred embodiment.
Figure 8:
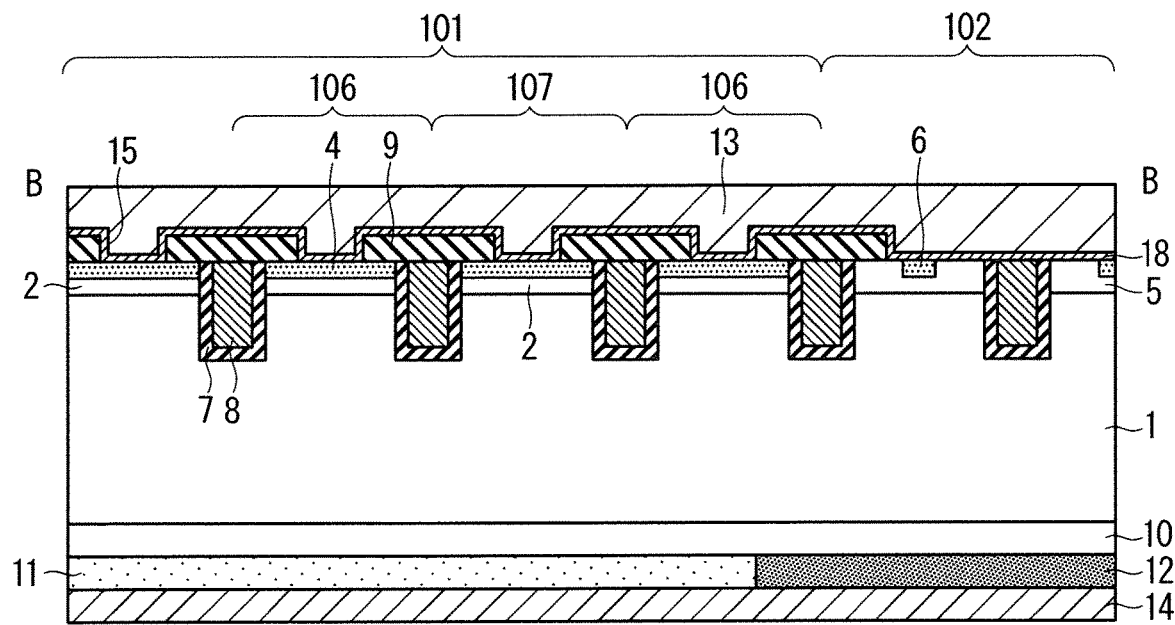
Figure 9:
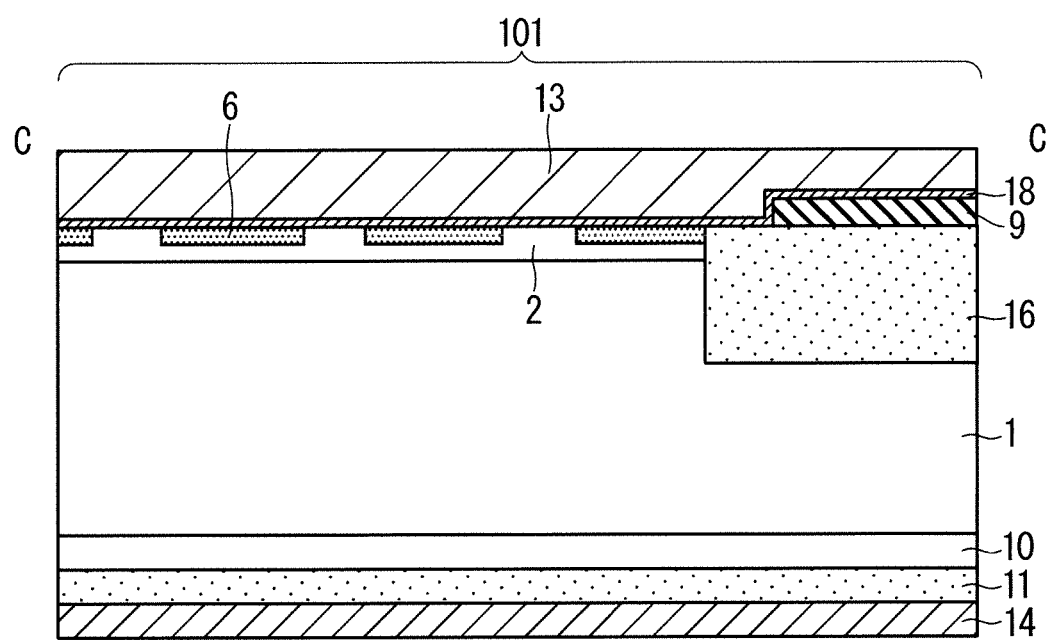

Next, an RC-IGBT 200 according to a second preferred embodiment will be described with reference to FIGS. 6 to 9. A plan view illustrating an entire chip of the RC-IGBT 200 is the same as FIG. 1, and FIG. 6 is a plan view illustrating the region X surrounded by the dashed line in FIG. 1. A cross-sectional view taken along the A-A line illustrated in FIG. 6 and viewed from the direction indicated by the arrows is illustrated in FIG. 7, a cross-sectional view taken along the B-B line and viewed from the direction indicated by the arrows is illustrated in FIG. 8, and a cross-sectional view taken along the C-C line and viewed from the direction indicated by the arrows is illustrated in FIG. 9. In FIGS. 6 to 9, the same configurations as those of the RC-IGBT 100 described with reference to FIGS. 2 to 5 are designated by the same reference numerals, and duplicate description will be omitted.

As illustrated in FIG. 6, an IGBT region 101 is divided into IGBT channel regions 106 and IGBT non-channel regions 107 by a plurality of embedded gate electrodes 8, and in the IGBT non-channel region 107 (second non-channel region) excluding the IGBT non-channel region 107 (first non-channel region) near an FWD region 102, among a plurality of the IGBT non-channel regions 107, a p$^+$-type contact layer 4 is formed at the boundary with a p-type well layer 16 in an outer peripheral region 103. The p$^+$-type contact layer 4 is connected to the p-type well layer 16.

That is, in the IGBT non-channel region 107 (IGBT non-channel region 107 near the FWD region 102) next to the IGBT channel region 106 adjacent to the FWD region 102, a p-type channel doped layer 2 is formed at the boundary with the p-type well layer 16 in the outer peripheral region 103, similarly to the RC-IGBT 100 of the first preferred embodiment. The p-type channel doped layer 2 is connected to the p-type well layer 16. However, in each of the IGBT non-channel regions 107 (IGBT non-channel regions 107 positioned away from the FWD region 102) other than the IGBT non-channel region 107 near the FWD region 102, the p$^+$-type contact layer 4 is formed at the boundary with the p-type well layer 16 in the outer peripheral region 103. The p+-type contact layer 4 is connected to the p-type well layer 16.

The area of a region, where the p$^+$-type contact layer 4 is arranged, in a region (mesa region) where the Si surface of the IGBT non-channel region 107 near the FWD region 102 is exposed is smaller than the area of a region, where the p$^+$-type contact layer 4 is arranged, in the mesa region in each of the IGBT non-channel regions 107 positioned away from the FWD region 102.

In the RC-IGBT 200 of the second preferred embodiment, the IGBT non-channel region 107 near the FWD region 102 is provided such that the area ratio of the p$^+$-type contact layer 4 having a high concentration of impurities is smaller than that of the p-type channel doped layer 2.

The IGBT region 101 near an n$^+$-type cathode layer 12 is greatly affected by the operation of the parasitic diode, but by providing the IGBT non-channel region 107, the effective anode concentration in this portion becomes low, so that the recovery loss during the operation of the FWD can be reduced.

In each of the IGBT non-channel regions 107 (second non-channel regions) positioned away from the FWD region 102, the p$^+$-type contact layer 4 is connected to the p-type well layer 16 in the outer peripheral region 103. Therefore, the holes flowing in from the outer peripheral region 103 during the operation of the IGBT can be made to flow into an emitter electrode 13 via a low-resistance layer. Thereby, a drop in a reverse bias safe operating area (RBSOA) can be minimized, and the recovery loss during the operation of the FWD can be reduced.

When it is configured such that the p$^+$-type contact layer 4 not only is in contact with the side surface of the p-type well layer 16 in the outer peripheral region 103, but also enters the p-type well layer 16, the drop in the RBSOA can be further suppressed. That is, the operation of the parasitic diode can be ignored at a position away from the FWD region 102, so that it can be expected to improve the characteristics of the IGBT even if the above configuration is adopted.

<Third Preferred Embodiment>

Figure 10:
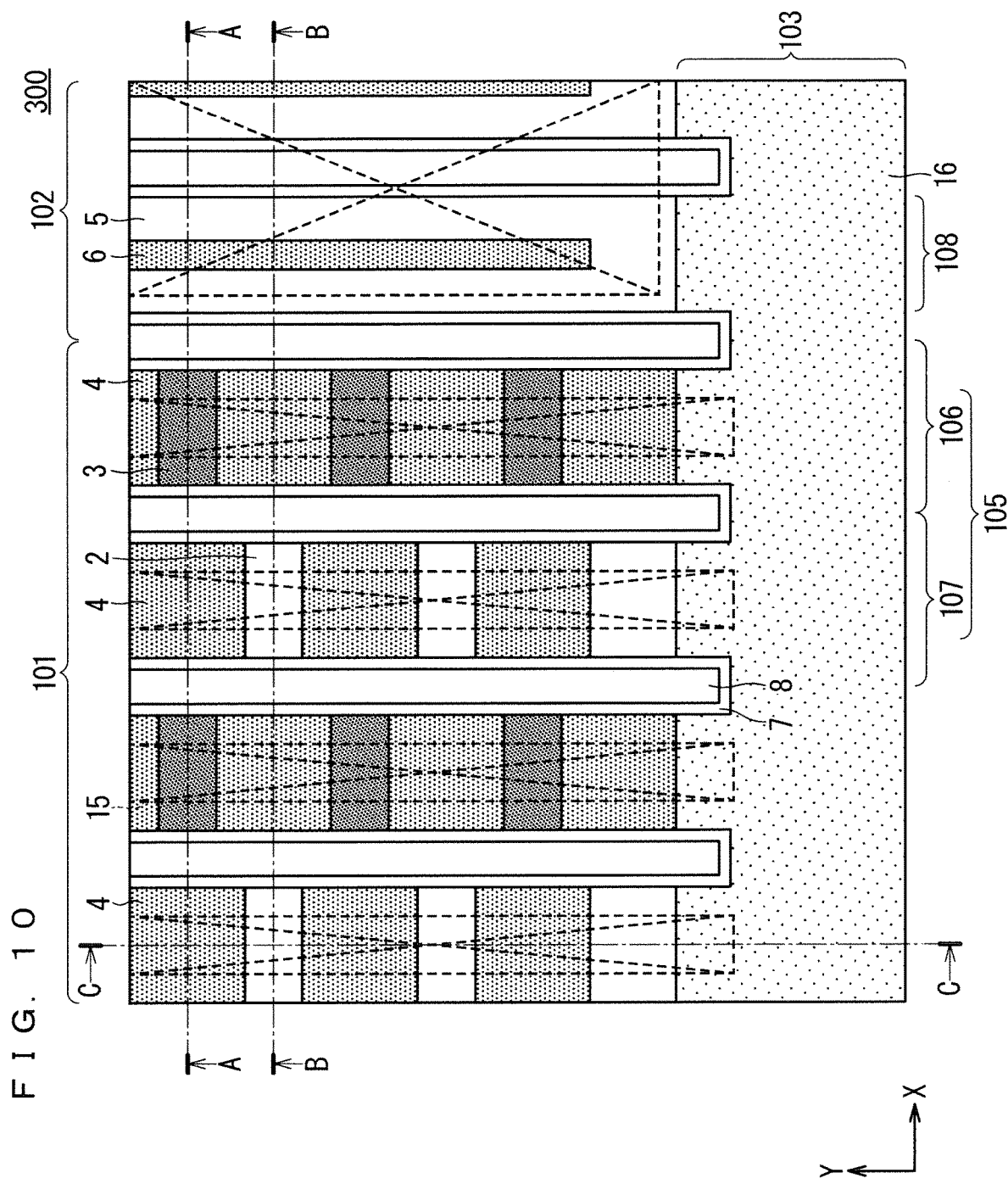
FIG. 10 is a partial plan view of an RC-IGBT according to a third preferred embodiment.
Figure 11:
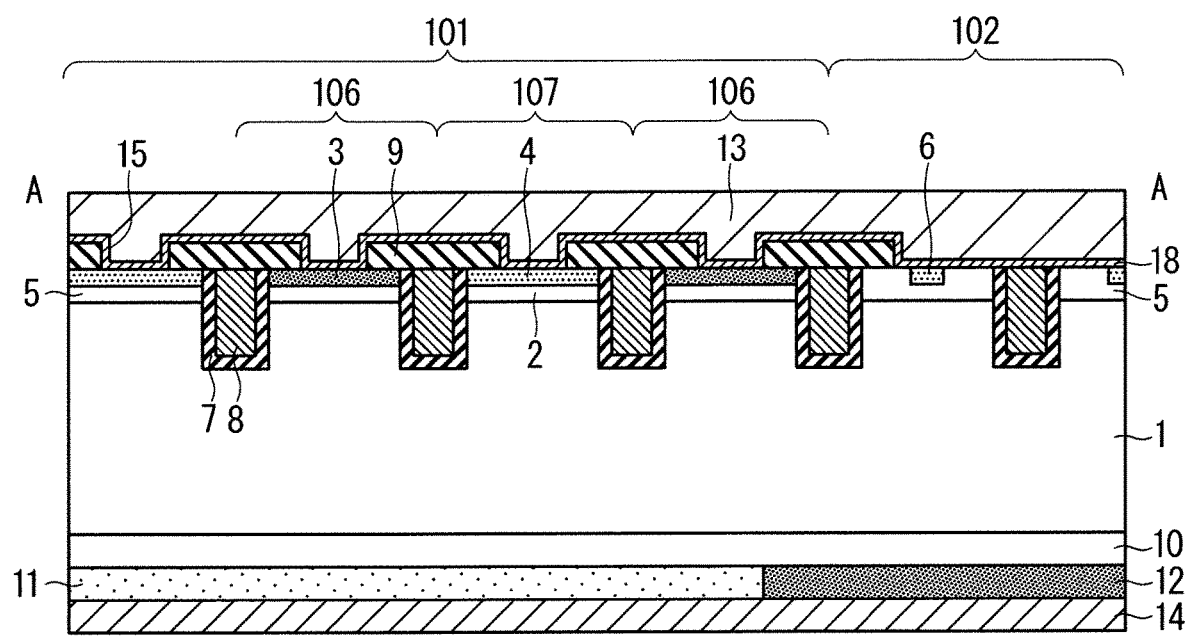
Figure 12:
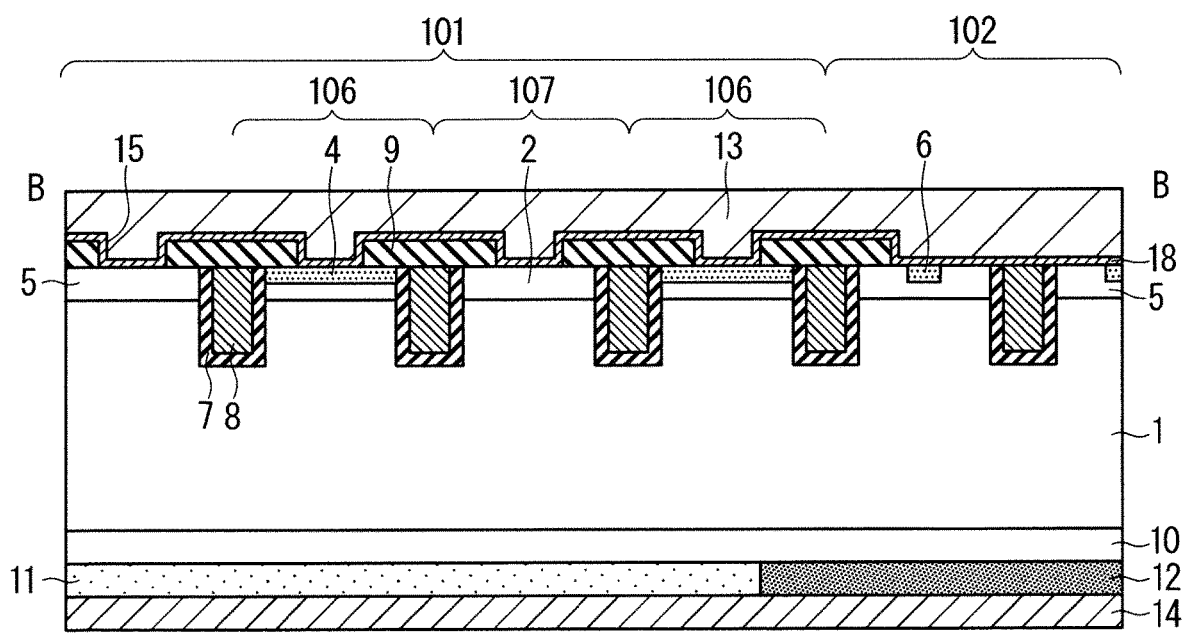

Next, an RC-IGBT 300 according to a third preferred embodiment will be described with reference to FIGS. 10 to 13. A plan view illustrating an entire chip of the RC-IGBT 300 is the same as FIG. 1, and FIG. 10 is a plan view illustrating the region X surrounded by the dashed line in FIG. 1. A cross-sectional view taken along the A-A line illustrated in FIG. 10 and viewed from the direction indicated by the arrows is illustrated in FIG. 11, a cross-sectional view taken along the B-B line and viewed from the direction indicated by the arrows is illustrated in FIG. 12, and a cross-sectional view taken along the C-C line and viewed from the direction indicated by the arrows is illustrated in FIG. 13. In FIGS. 10 to 13, the same configurations as those of the RC-IGBT 100 described with reference to FIGS. 2 to 5 are designated by the same reference numerals, and duplicate description will be omitted.

As illustrated in FIG. 10, an IGBT region 101 is divided into IGBT channel regions 106 and IGBT non-channel regions 107 by a plurality of embedded gate electrodes 8. P$^+$-type contact layers 4 formed in each of a plurality of the IGI3T non-channel regions 107 are arranged at positions facing, in plan view, n$^+$-type emitter layers 3 in the IGBT channel region 106 separated via the embedded gate electrode 8.

In the IGBT non-channel region 107, p-type channel doped layers 2 and the p$^+$-type contact layers 4 are alternately formed, and the p-type channel doped layer 2 is formed at the boundary with a p-type well layer 16 in an outer peripheral region 103. The configuration in which the p-type channel doped layer 2 is connected to the p-type well layer 16 is the same as that of the RC-IGBT 100 of the first preferred embodiment.

Next, the operation of the RC-IGBT 300 will be described. The turn-off operation during the operation of the IGBT is completed by discharging excess carriers accumulated in an n$^-$-type drift layer 1 by conductivity modulation in the on-state. At this time, it is a normal operation that the holes flow from the p-type channel doped layer 2 to an emitter electrode 13 via the p$^+$-type contact layer 4. However, if the sheet resistance of the p-type channel doped layer 2 directly under the n$^+$-type emitter layer 3 is high, and if problems such as hole current concentration occur, a forward bias is applied to a p-n junction between the p-type channel doped layer 2 and the n$^+$-type emitter layer 3. Therefore, holes flow from the p-type channel doped layer 2 to the n$^+$-type emitter layer 3 without flowing from the p-type channel doped layer 2 to the p$^+$-type contact layer 4, which may cause a failure in the turn-off.

An effective countermeasure against this is that in order to prevent the p-n junction between the p-type channel doped layer 2 and the n$^+$-type emitter layer 3 from being forward-biased and latched up, the resistance is reduced by arranging a p-type impurity layer having a high concentration, that is, the p$^+$-type contact layer 4, around the n$^+$-type emitter layer 3, and by connecting it to the emitter potential, a potential increase is suppressed.

In the third preferred embodiment, the p$^+$-type contact layer 4 is arranged, in plan view, next to the n$^+$-type emitter layer 3 in the IGBT channel region 106, and in the IGBT non-channel region 107, the p$^+$-type contact layers 4 are arranged at positions facing, in plan view, the n+-type emitter layers 3 in the IGBT channel region 106 separated by the embedded gate electrode 8. Therefore, the n$^+$-type emitter layer 3 is configured to be surrounded, in plan view, by the p$^+$-type contact layers 4, so that the connection to the emitter potential is strengthened, and the risk of being latched up during the operation of the IGBT can be reduced.

In the IGBT non-channel region 107, the p-type channel doped layers 2 and the p$^+$-type contact layers 4 are alternately formed, and the area of the p$^+$-type contact layer 4 having a high concentration of impurities is larger than the area of the p-type channel doped layer 2, but is made small enough to reduce the recovery loss during the operation of the FWD.

<Fourth Preferred Embodiment>

Figure 14:
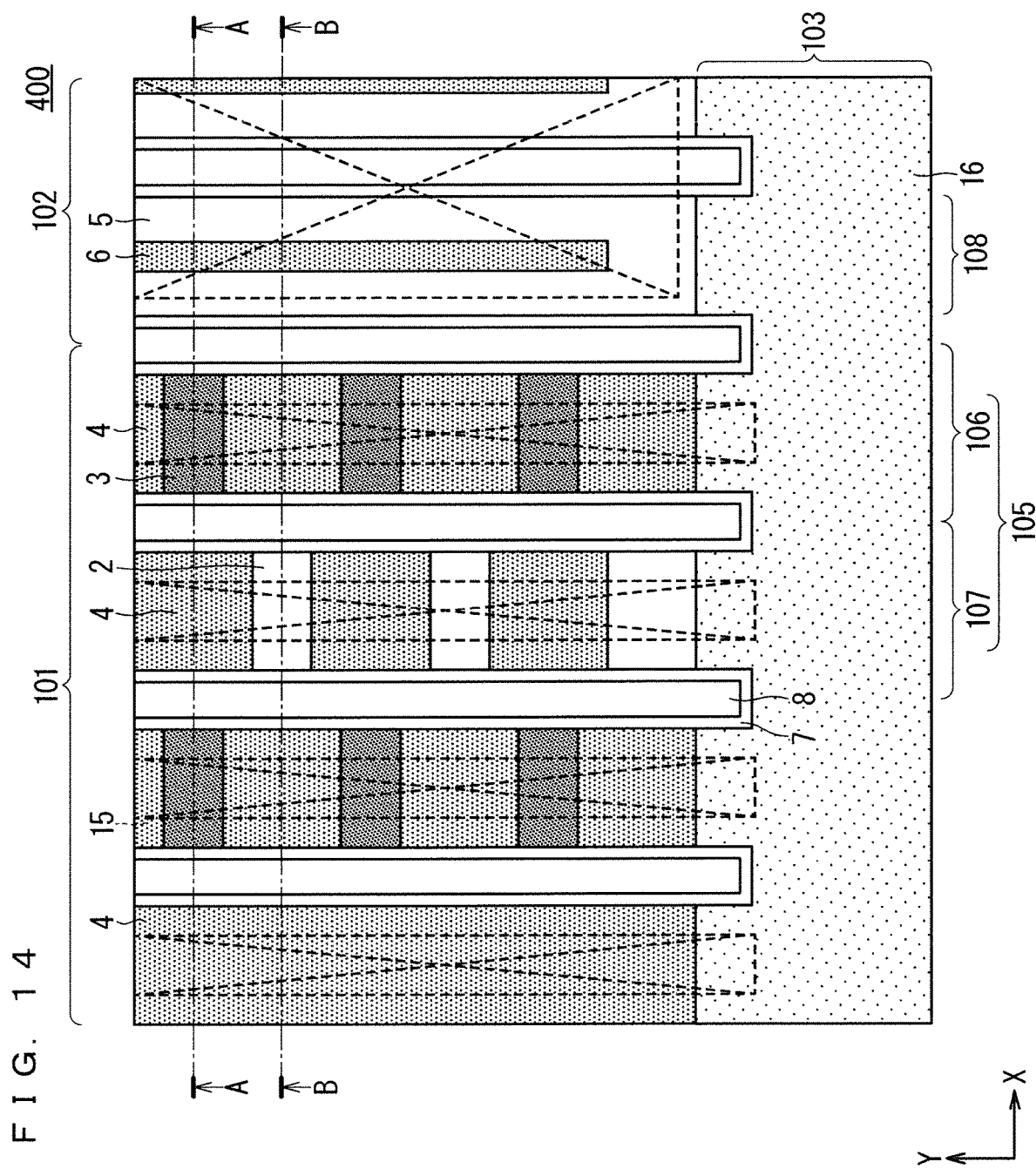
FIG. 14 is a partial plan view of an RC-IGBT according to a fourth preferred embodiment.
Figure 15:
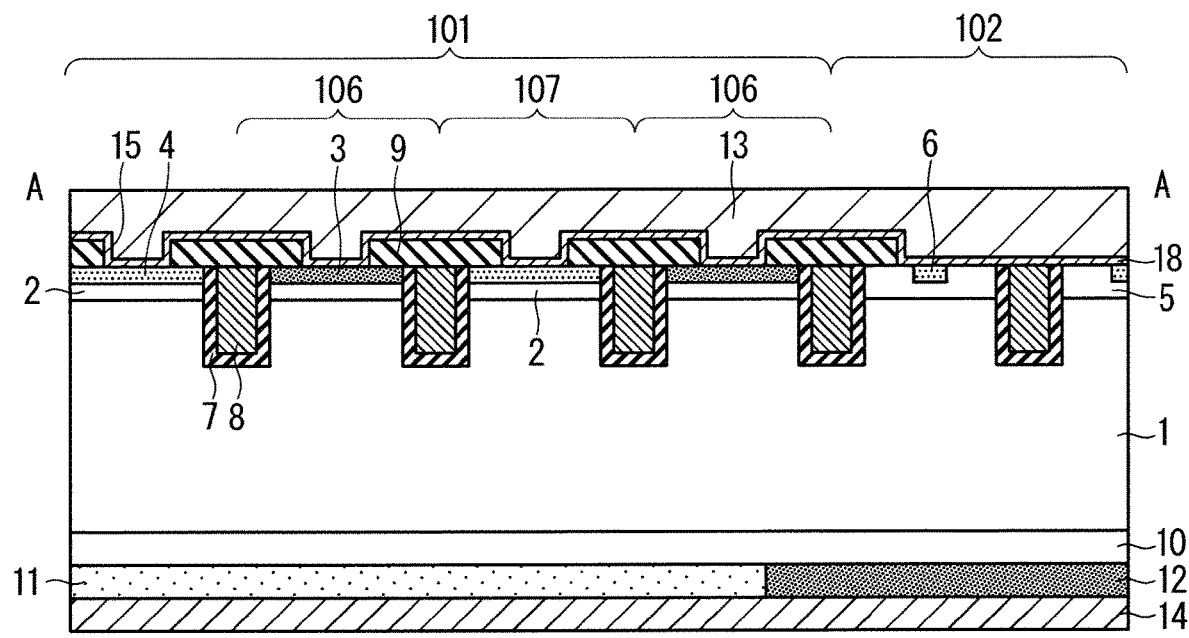
FIGS. 15 and 16 are each a partial cross-sectional view of the RC-IGBT according to the fourth preferred embodiment.
Figure 16:
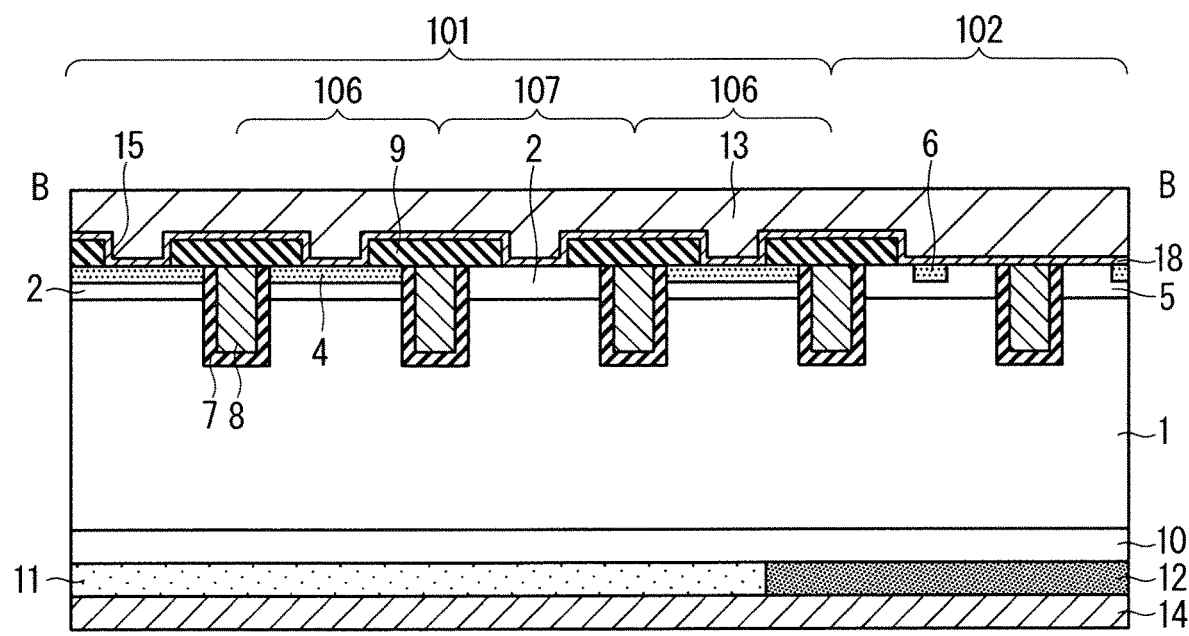

Next, an RC-IGBT 400 according to a fourth preferred embodiment will be described with reference to FIGS. 14 to 16. A plan view illustrating an entire chip of the RC-IGBT 400 is the same as FIG. 1, and FIG. 14 is a plan view illustrating the region X surrounded by the dashed line in FIG. 1. A cross-sectional view taken along the A-A line illustrated in FIG. 14 and viewed from the direction indicated by the arrows is illustrated in FIG. 15, and a cross-sectional view taken along the B-B line and viewed from the direction indicated by the arrows is illustrated in FIG. 16. In FIGS. 14 to 16, the same configurations as those of the RC-IGBT 100 described with reference to FIGS. 2 to 5 are designated by the same reference numerals, and duplicate description will be omitted.

As illustrated in FIG. 14, an IGBT region 101 is divided into IGBT channel regions 106 and IGBT non-channel regions 107 by a plurality of embedded gate electrodes 8. in the IGBT non-channel region 107 (second non-channel region) excluding the IGBT non-channel region 107 (first non-channel region) near an FWD region 102, among a plurality of the IGBT non-channel regions 107, a p-type contact layer 4 is formed on the entire Si surface.

That is, in FIG. 14, a p-type channel doped layer 2 is formed at the boundary with a p-type well layer 16 in an outer peripheral region 103 in the IGBT non-channel region 107 (IGBT non-channel region 107 near the FWD region 102) next to the IGBT channel region 106 adjacent to the FWD region 102, similarly to the RC-IGBT 100 of the first preferred embodiment. The p-type channel doped layer 2 is connected to the p-type well layer 16. However, in each of the IGBT non-channel regions 107 (IGBT non-channel regions 107 positioned away from the FWD region 102) other than the IGBT non-channel region 107 near the FWD region 102, the p$^+$-type contact layer 4 is formed on the entire Si surface. The p$^+$-type contact layer 4 is connected to the p-type well layer 16.

In the IGBT non-channel region 107 near the FWD region 102, the p$^+$-type contact layers 4 are arranged at positions facing, in plan view, n$^+$-type emitter layers 3 in the IGBT channel region 106 separated via the embedded gate electrode 8, similarly to the RC-IGBT 300 of the third preferred embodiment.

In RC-IGBT 400, the p-type channel doped layers 2 and the p-type contact layers 4 are alternately formed in the region of the IGBT non-channel region 107 that is formed near the FWD region 102, that is, near an n$^+$-type cathode layer 12 on the back surface and is likely to act as a parasitic diode. Thereby, the effective concentration of p-type impurities is reduced, so that the recovery loss during the operation of the FWD can be reduced.

On the other hand, in each of the IGBT non-channel regions 107 located at positions that are away from the FWD region 102, that is, away from an n$^+$-type cathode layer 12 on the back surface and where they are less likely to act as a parasitic diode, the p$^+$-type contact layer 4 is formed on the entire surface. Thereby, a forward bias is suppressed from being applied to a p-n junction between the p-type channel doped layer 2 and the n$^+$-type emitter layer 3 during the operation of the IGBT, so that a drop in the breakdown resistance of the RBSOA, etc., can be suppressed.

<Modification Example>

In the RC-IGBT 400 described above, the IGBT non-channel region 107 near the FWD region 102 has a configuration in which the p-type channel doped layers 2 and the p$^+$-type contact layers 4 are alternately formed, but without being limited to this column, the configuration in which the p-type channel doped layers 2 and the p$^+$-type contact layers 4 are alternately formed can also be applied to the IGBT non-channel regions 107 in other columns.

The p-type impurity region in the IGBT region 101 near the n$^+$-type cathode layer 12 operates as the anode region of a parasitic pin diode and becomes a current path, but the farther it is from the n$^+$-type cathode layer 12, the less it is affected even if it operates as the anode region. This is because it has the same effect as that when the thickness of the effective n$^-$-type drift layer 1 of the parasitic pin diode is increased. The influence of the parasitic diode is reduced in the region away from the n$^+$-type cathode layer 12 by a distance equivalent to or about 1.5 times the thickness of the substrate.

Therefore, the influence of the parasitic diode can be reduced by providing the IGBT non-channel region 107, in which the p-type channel doped layers 2 and the p$^+$-type contact layers 4 are alternately formed, in the region away from the end portion of the n$^+$-type cathode layer 12, that is, from the end portion of the FWD region 102, by a distance equal to or about 1.5 times the thickness of the substrate. Thereby, the effect of further reducing the recovery loss can be obtained.

The area ratios of the p-type channel doped layer 2 and the p$^+$-type contact layer 4 in the IGBT non-channel region 107 near the FWD region 102 can be changed depending on the situation. In a portion near the FWD region 102 where the influence of the parasitic diode is large, the area ratio of the p$^+$-type contact layer 4 is made small by giving priority to reducing the recovery loss, and as the distance from the FWD region 102 is increased, the ratio of the p$^+$-type contact layer 4 is made larger. Thereby, focus can be placed on improving the RBSOA capability during the operation of the IGBT.

<Fifth Preferred Embodiment>

Figure 17:
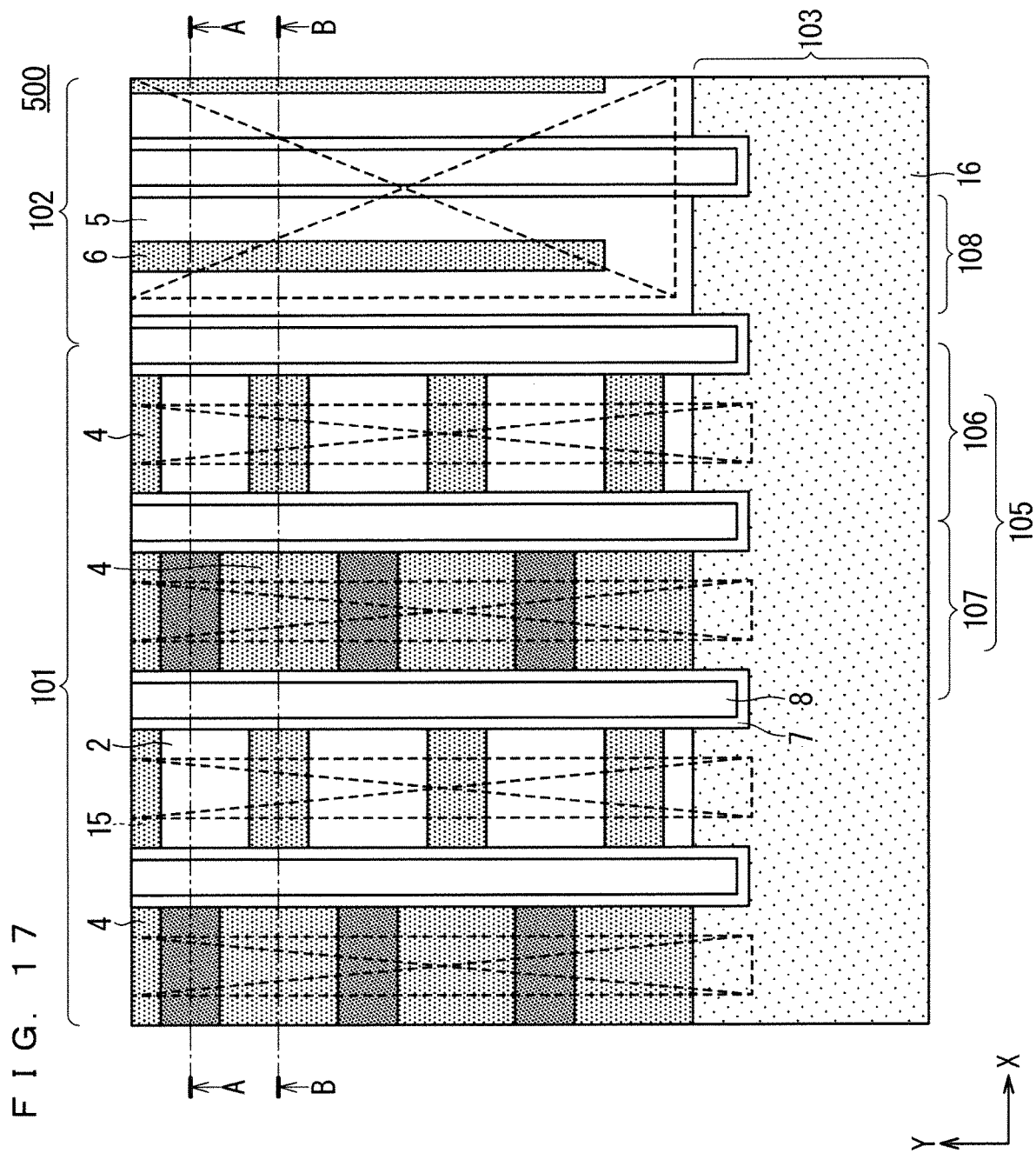
FIG. 17 is a partial plan view of an RC-IGBT according to a fifth preferred embodiment.
Figure 18:
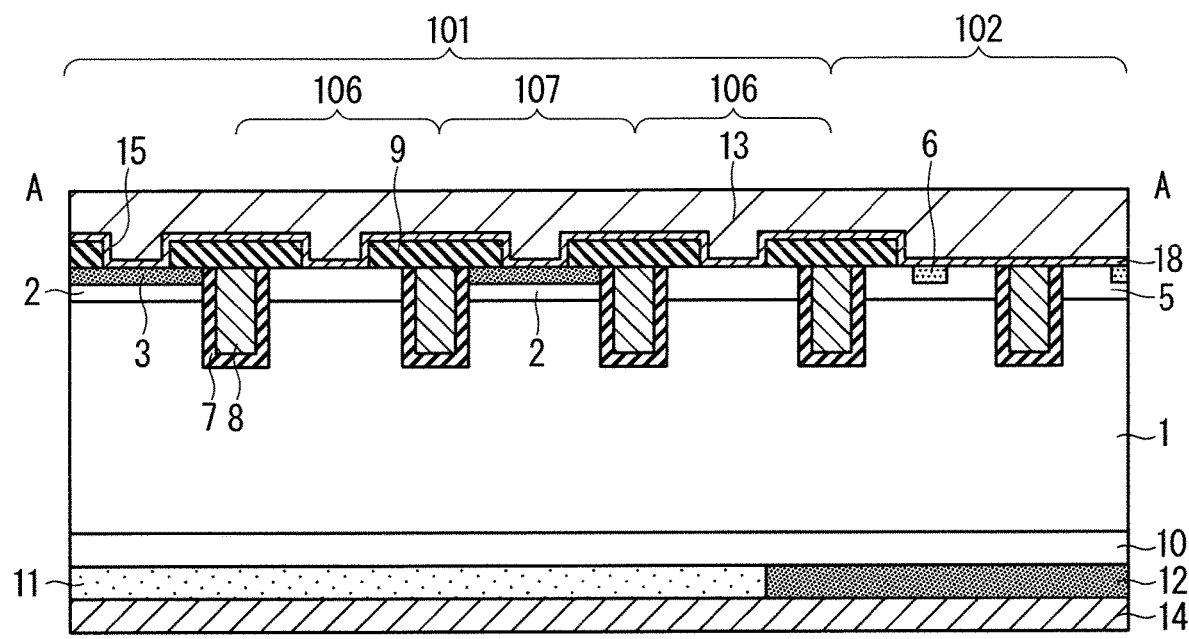
FIGS. 18 and 19 are each a partial cross-sectional view of the RC-IGBT according to the fifth preferred embodiment.
Figure 19:
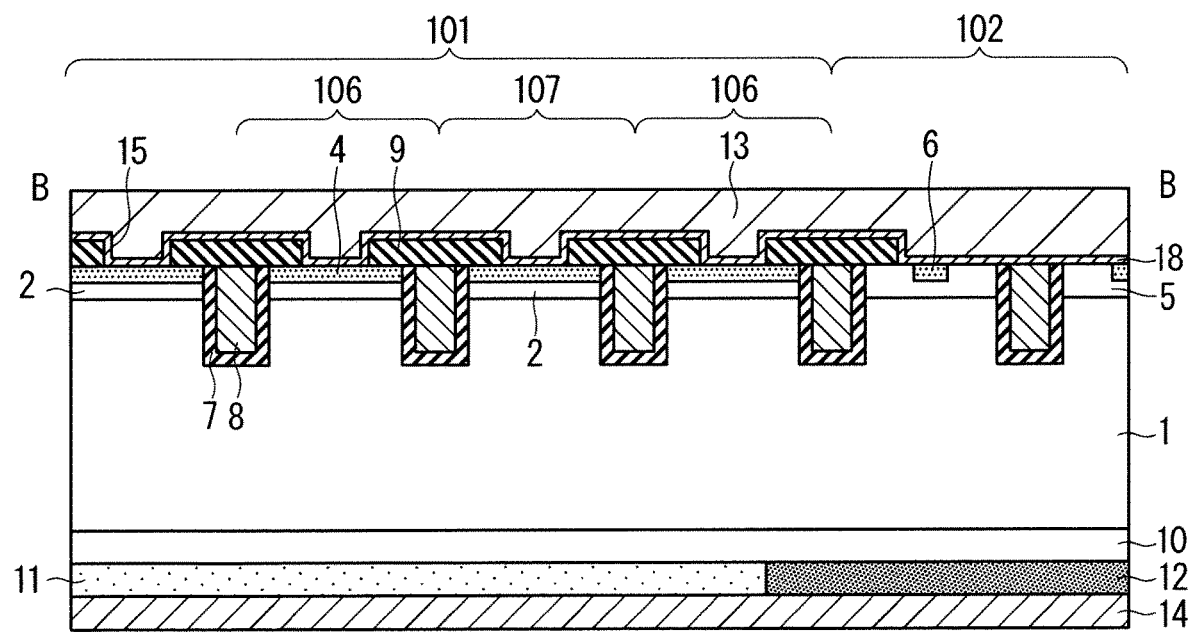

Next, an RC-IGBT 500 according to a fifth preferred embodiment will be described with reference to FIGS. 17 to 19. A plan view illustrating an entire chip of the RC-IGBT 500 is the same as FIG. 1, and FIG. 17 is a plan view illustrating the region X surrounded by the dashed line in FIG. 1. A cross-sectional view taken along the A-A line illustrated in FIG. 17 and viewed from the direction indicated by the arrows is illustrated in FIG. 18, and a cross-sectional view taken along the B-B line and viewed from the direction indicated by the arrows is illustrated in FIG. 19. In FIGS. 17 to 19, the same configurations as those of the RC-IGBT 100 described with reference to FIGS. 2 to 5 are designated by the same reference numerals, and duplicate description will be omitted.

As illustrated in FIG. 17, an IGBT region 101 is divided into IGBT channel regions 106 and IGBT non-channel regions 107 by a plurality of embedded gate electrodes 8. The IGBT non-channel region 107 is arranged adjacent to an FWD region 102, and next to it, the IGBT channel region 106 is arranged. Thereafter, the IGBT non-channel regions 107 and the IGBT channel regions 106 are alternately arranged. In the IGBT non-channel region 107, p-type channel doped layers 2 and $p^+$-type contact layers 4 are alternately formed.

In the RC-IGBT 500, the IGBT non-channel region 107 whose effective concentration of p-type impurities is reduced is formed in a region adjacent to the FWD region 102, the region being most likely to operate as a parasitic diode in the IGBT region 101. Thereby, the recovery loss during the operation of the FWD can be reduced.

<Sixth Preferred Embodiment>

Figure 20:
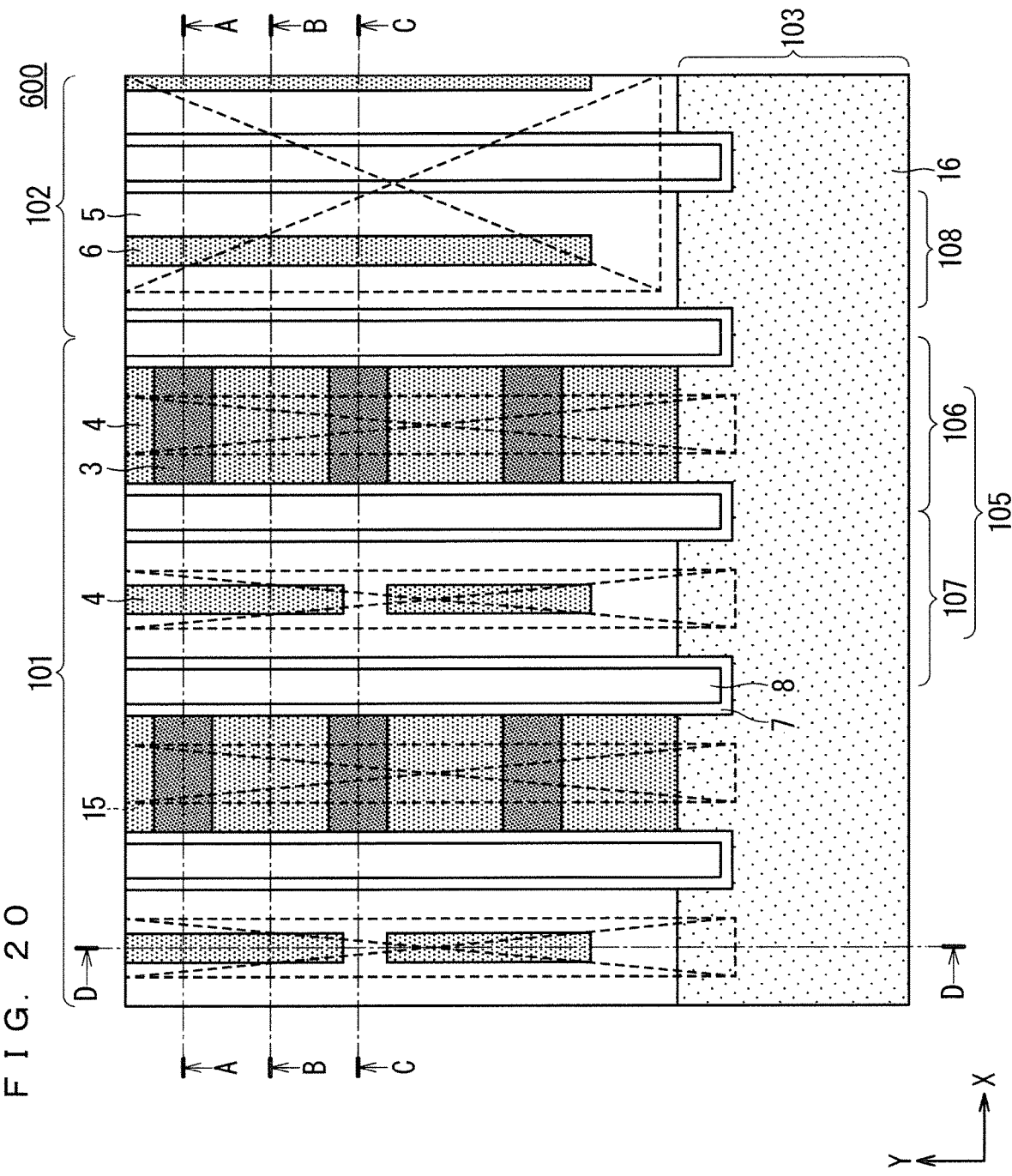
FIG. 20 is a partial plan view of an RC-IGBT according to a sixth preferred embodiment.
Figure 21:
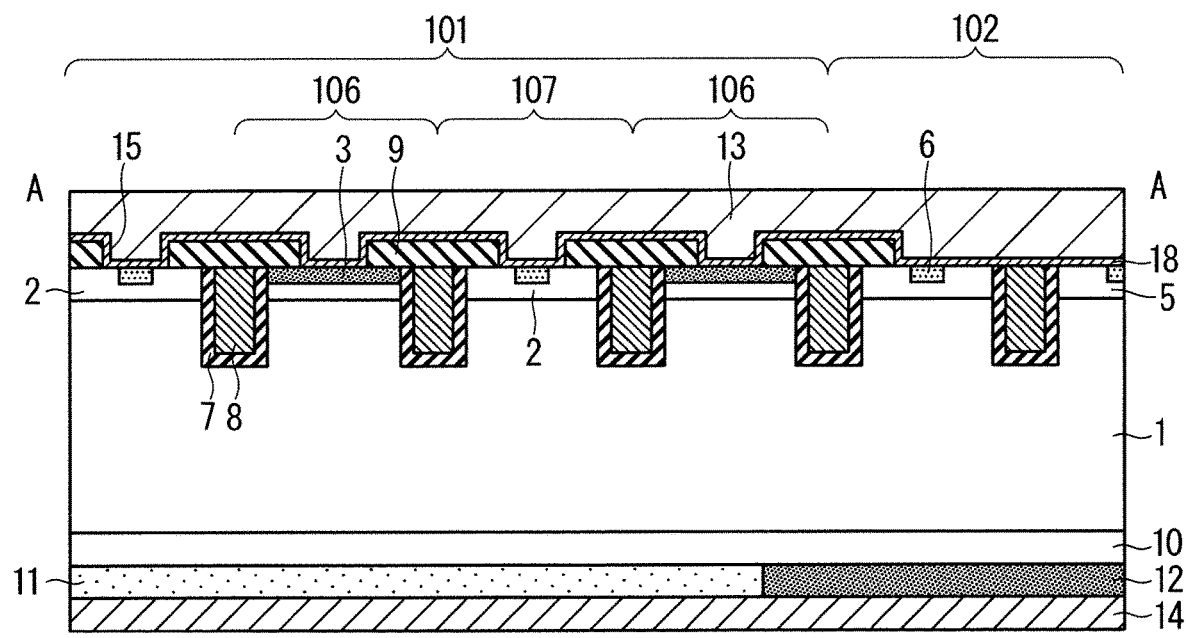
FIGS. 21 to 24 are each a partial cross-sectional view of the RC-IGBT according to the sixth preferred embodiment.
Figure 22:
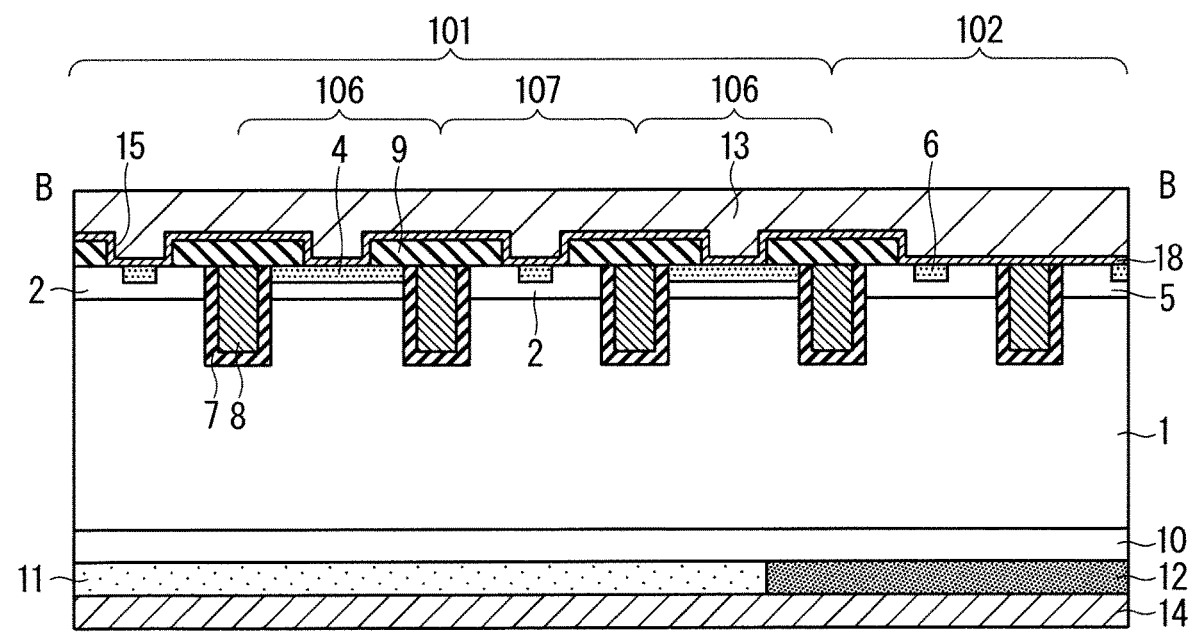
Figure 23:
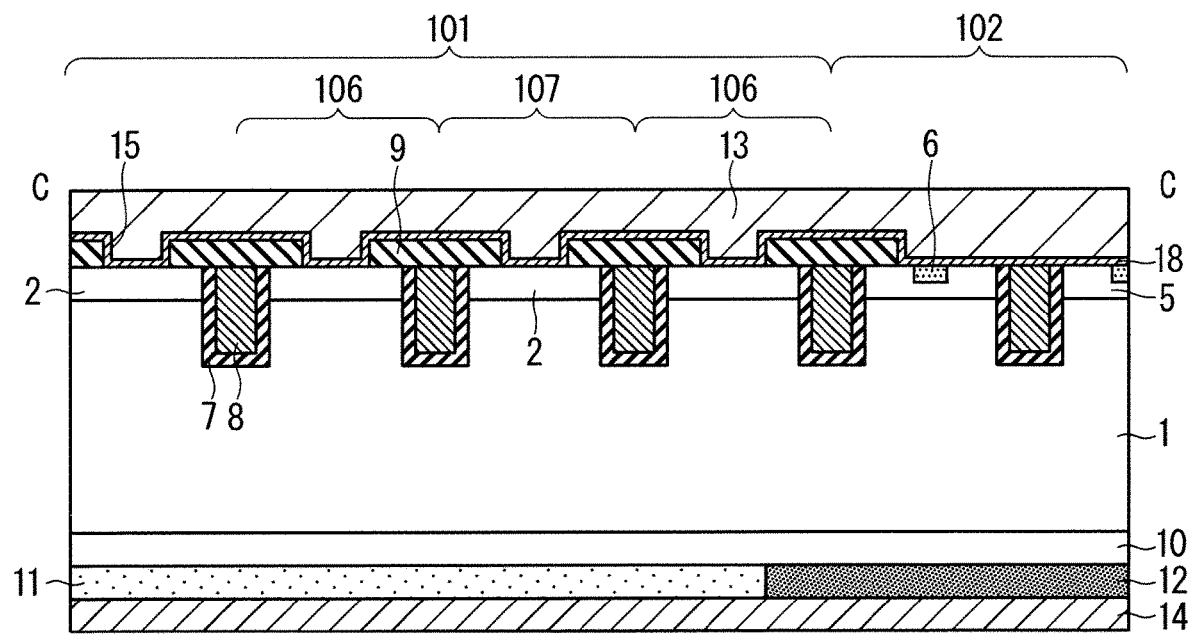
Figure 24:
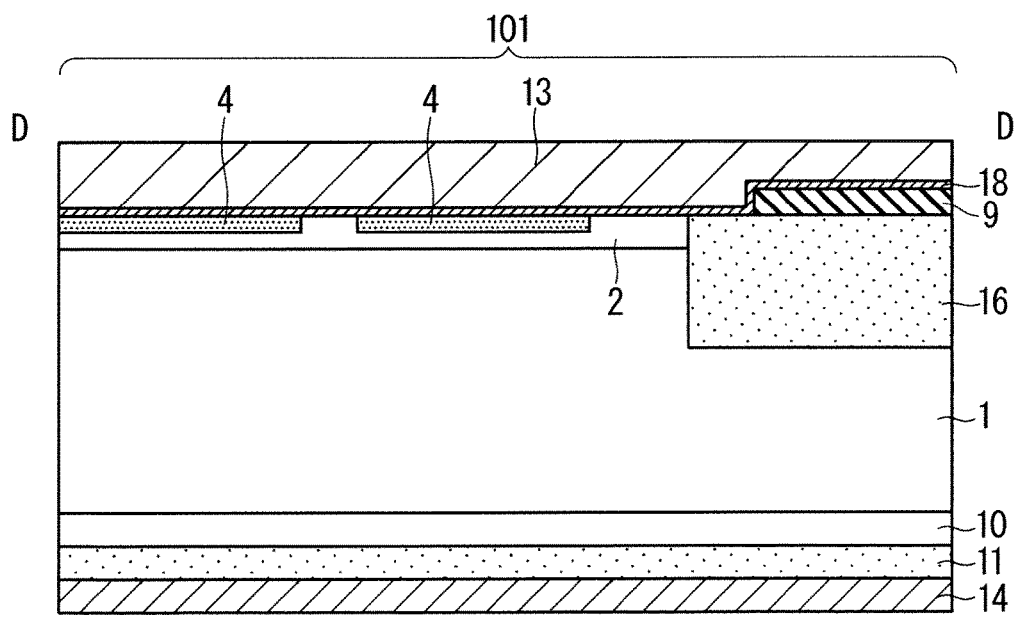

Next, an RC-IGBT 600 according to a sixth preferred embodiment will be described with reference to FIGS. 20 to 24. A plan view illustrating an entire chip of the RC-IGBT 600 is the same as FIG. 1, and FIG. 20 is a plan view illustrating the region X surrounded by the dashed line in FIG. 1. A cross-sectional view taken along the A-A line illustrated in FIG. 20 and viewed from the direction indicated by the arrows is illustrated in FIG. 21, a cross-sectional view taken along the B-B line and viewed from the direction indicated by the arrows is illustrated in FIG. 22, a cross-sectional view taken along the C-C line and viewed from the direction indicated by the arrows is illustrated in FIG. 23, and a cross-sectional view taken along the D-D line and viewed from the direction indicated by the arrows is illustrated in FIG. 24. In FIGS. 20 to 24, the same configurations as those of the RC-IGBT 100 described with reference to FIGS. 2 to 5 are designated by the same reference numerals, and duplicate description will be omitted.

As illustrated in FIG. 20, an IGBT region 101 is divided into IGBT channel regions 106 and IGBT non-channel regions 107 by a plurality of embedded gate electrodes 8. In the IGBT non-channel region 107, a p-type channel doped layer 2 and $p^+$-type contact layers 4 are formed. A plurality of the $p^+$-type contact layers 4, each having, in plan view, an elongated rectangular shape extending in the Y direction, are provided. They are arranged discontinuously at intervals so as to form a line in the longitudinal direction thereof. The arrangement interval between the $p^+$-type contact layers 4 in the IGBT non-channel region 107 is formed to be smaller than the length, in the longitudinal direction (Y direction), of the $p^+$-type contact layer 4.

The area ratio of the $p^+$-type contact layer 4 in a mesa region (the portion where the Si surface is exposed) in the IGBT non-channel region 107 can be made about equal to that of the RC-IGBT 100 of the first preferred embodiment.

In the RC-IGBT 600, the area ratio of the $p^+$-type contact layer 4 in the IGBT non-channel region 107 is set below a certain level in the IGBT region 101, so that the effective concentration of p-type impurities in the IGBT non-channel region 107 is reduced. Thereby, the IGBT region 101 can be suppressed from operating as a parasitic diode, and the recovery loss during the operation of the FWD can be reduced.

Further, by forming the $p^+$-type contact layer 4 so as to have a shape that is, in plan view, an elongated rectangular shape and forming the arrangement interval between them so as to be smaller than its length in the longitudinal direction, a pattern size becomes large, the dimensional variation during manufacturing can be suppressed, and the recovery loss during the operation of the FWD can be reduced.

<Seventh Preferred Embodiment>

Figure 25:
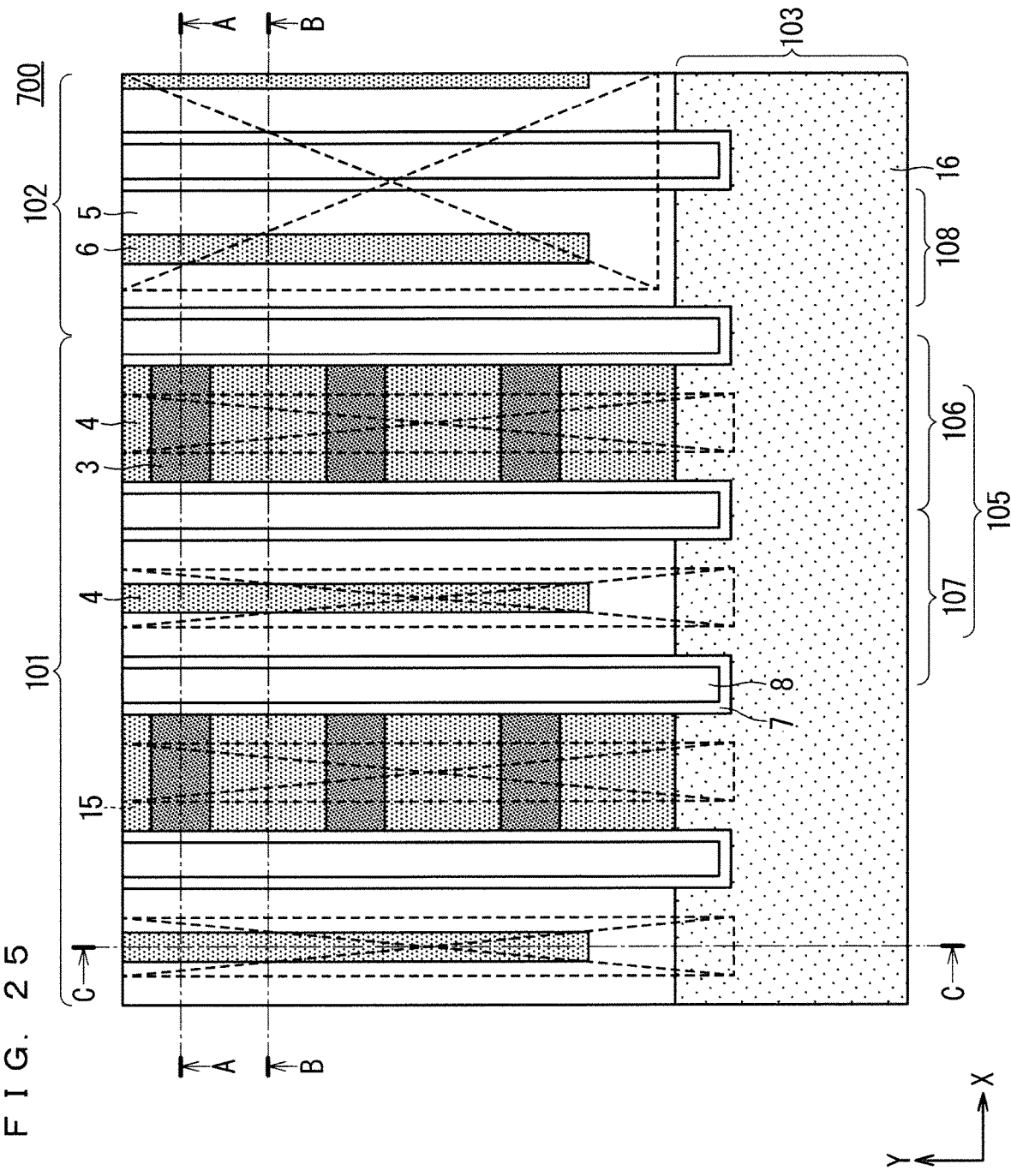
FIG. 25 is a partial plan view of an RC-IGI3T according to a seventh preferred embodiment.
Figure 26:
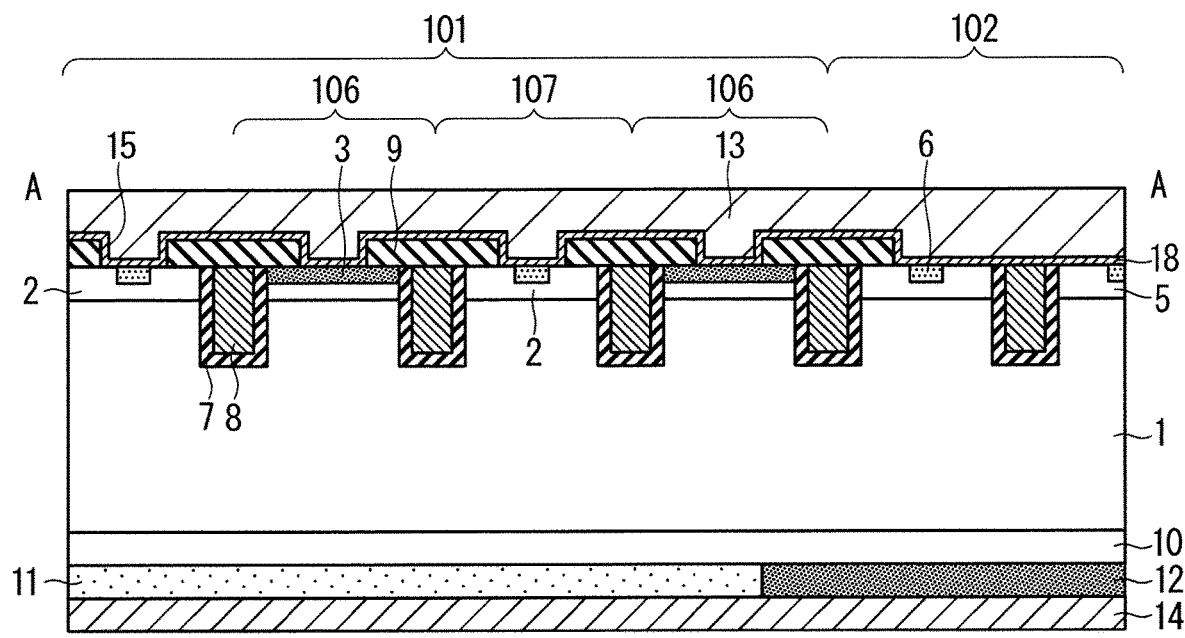
Figure 27:
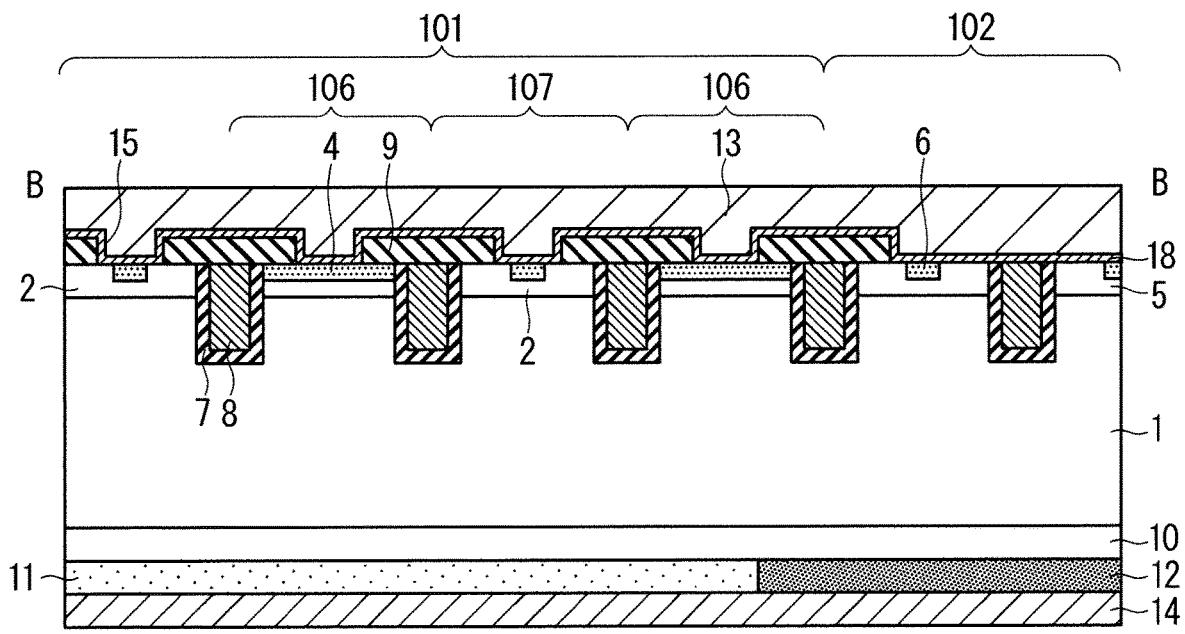

Next, an RC-IGBT 700 according to a seventh preferred embodiment will be described with reference to FIGS. 25 to 28. A plan view illustrating an entire chip of the RC-IGBT 700 is the same as FIG. 1, and FIG. 25 is a plan view illustrating the region X surrounded by the dashed line in FIG. 1. A cross-sectional view taken along the A-A line illustrated in FIG. 25 and viewed from the direction indicated by the arrows is illustrated in FIG. 26, a cross-sectional view taken along the B-B line and viewed from the direction indicated by the arrows is illustrated in FIG. 27, and a cross-sectional view taken along the C-C line and viewed from the direction indicated by the arrows is illustrated in FIG. 28. In FIGS. 25 to 28, the same configurations as those of the RC-IGBT 100 described with reference to FIGS. 2 to 5 are designated by the same reference numerals, and duplicate description will be omitted.

As illustrated in FIG. 25, an IGBT region 101 is divided into IGBT channel regions 106 and IGBT non-channel regions 107 by a plurality of embedded gate electrodes 8. In the IGBT non-channel region 107, a p-type channel doped layer 2 and a $p^+$-type contact layer 4 are formed. The $p^+$-type contact layer 4 is formed in, in plan view, a continuous single line shape extending in the Y direction.

The area ratio of the $p^+$-type contact layer 4 in a mesa region (the portion where the Si surface is exposed) in the IGBT non-channel region 107 can be made about equal to that of the RC-IGBT 100 of the first preferred embodiment.

In the RC-IGBT 700, the area ratio of the $p^+$-type contact layer 4 in the IGBT non-channel region 107 is set below a certain level in the IGBT region 101, so that the effective concentration of p-type impurities in the IGBT non-channel region 107 is reduced. Thereby, the IGBT region 101 can be suppressed from operating as a parasitic diode, and the recovery loss during the operation of the FWD can be reduced.

Further, by forming the $p^+$-type contact layer 4 so as to have, in plan view, an elongated rectangular shape, that is, a continuous single line, a pattern size becomes large, the dimensional variation during manufacturing can be suppressed, and the recovery loss during the operation of the FWD can be reduced.

<Eighth Preferred Embodiment>

Figure 30:
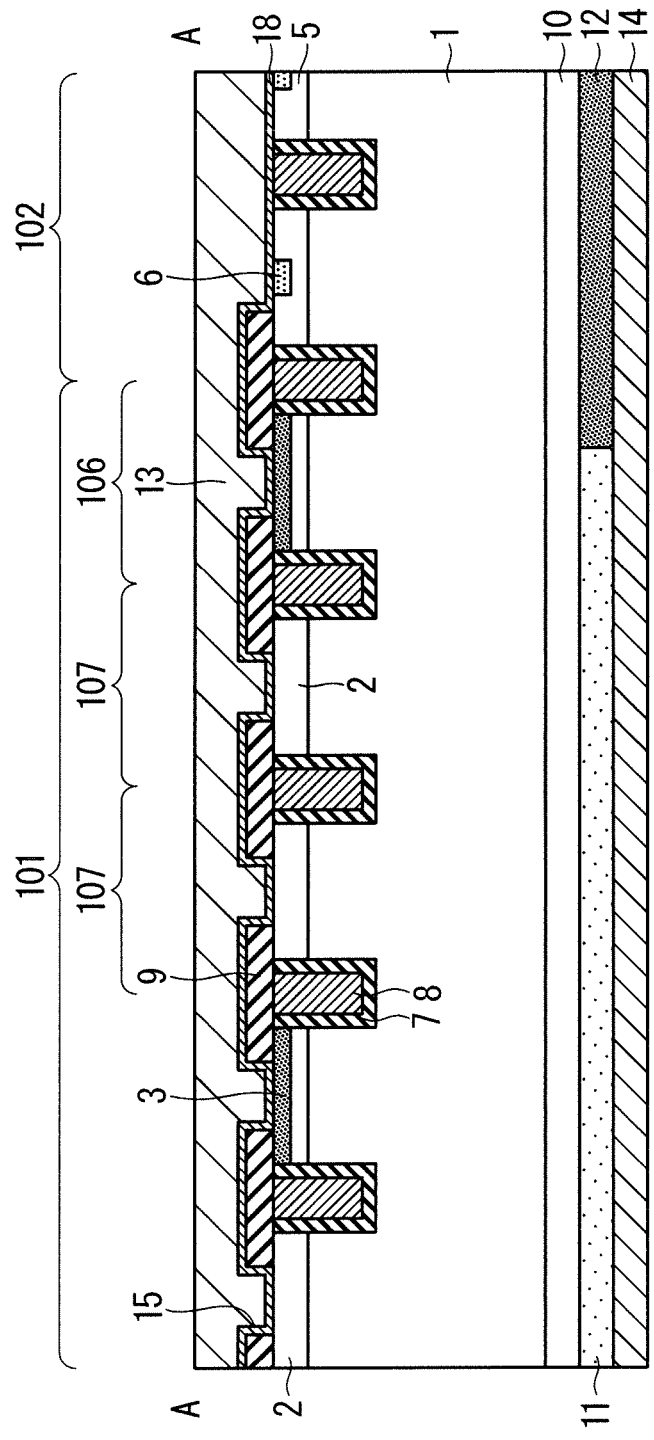
FIGS. 30 and 31 are each a partial cross-sectional view of the RC-IGBT according to the eighth preferred embodiment.
Figure 31:
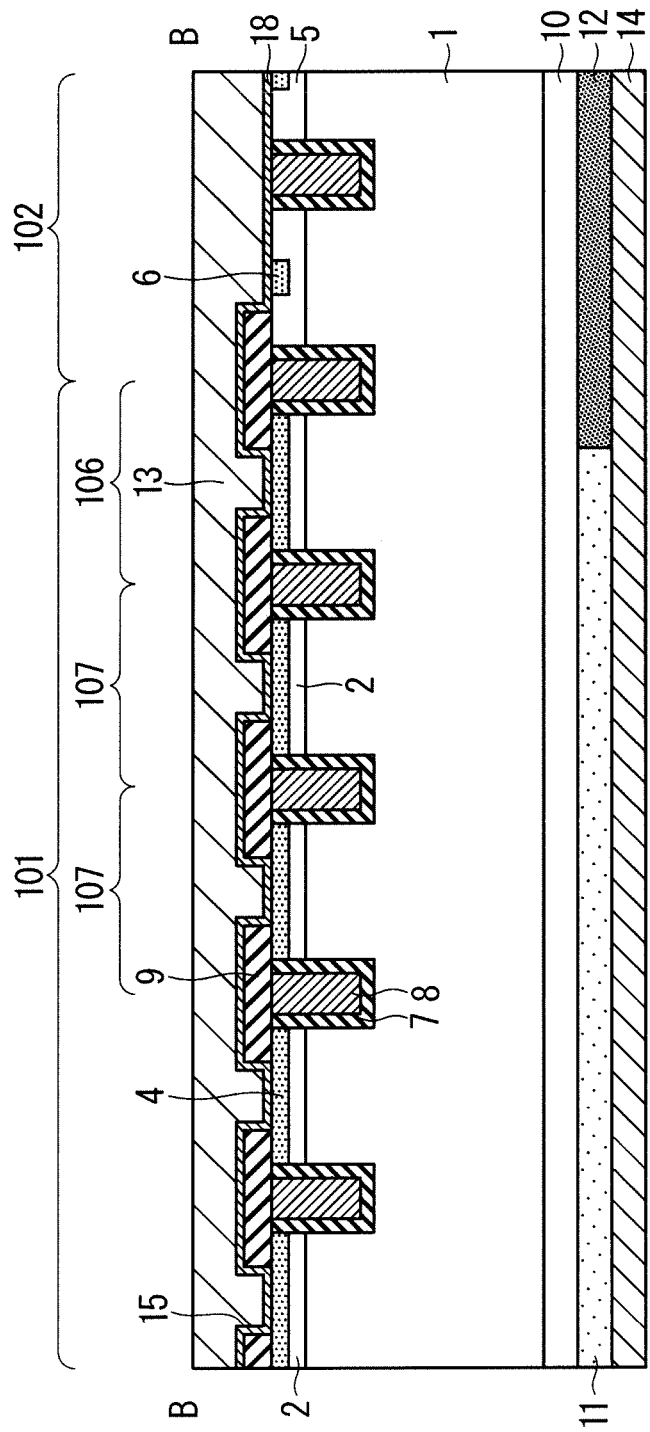

Next, an RC-IGBT 800 according to an eighth preferred embodiment will be described with reference to FIGS. 29 to 31. A plan view illustrating an entire chip of the RC-IGBT 800 is the same as FIG. 1, and FIG. 29 is a plan view illustrating the region X surrounded by the dashed line in FIG. 1. A cross-sectional view taken along the A-A line illustrated in FIG. 29 and viewed from the direction indicated by the arrows is illustrated in FIG. 30, and a cross-sectional view taken along the B-B line and viewed from the direction indicated by the arrows is illustrated in FIG. 31. In FIGS. 29 to 31, the same configurations as those of the RC-IGBT 100 described with reference to FIGS. 2 to 5 are designated by the same reference numerals, and duplicate description will be omitted.

As illustrated in FIG. 29, an IGBT region 101 is divided into IGBT channel regions 106 and IGBT non-channel regions 107 by a plurality of embedded gate electrodes 8. The arrangement ratio of the IGBT channel region 106 in the IGBT region 101 is 1/3.

In FIG. 29, the IGBT channel region 106 is arranged adjacent to an FWD region 102; next to it, the IGBT non-channel region 107 is arranged; and also next to it, the IGBT non-channel region 107 is arranged. By repeating such an arrangement in the IGBT region 101, the ratio of the IGBT channel region 106 to the IGBT non-channel region 107 becomes 1:2.

When the IGBT channel regions 106 and the IGBT non-channel regions 107 are arranged as described above, there exist the embedded gate electrodes 8 sandwiched between the IGBT non-channel regions 107. However, like the dummy trench gate, this embedded gate electrode 8 is connected to an emitter electrode in a non-illustrated region to serve as an embedded emitter electrode 17. Therefore, the potential of the embedded gate electrode 8 does not matter.

In the RC-IGBT 800, the saturation current and short circuit capacity can be set to desired values by reducing the number of IGBT channel regions 106, or by so-called thinning out the IGBT channel regions 106.

Further, the area ratio of the p$^+$-type contact layer 4 in the IGBT non-channel region 107 is reduced to reduce the effective concentration of p-type impurities in the IGBT non-channel region 107. Thereby, the variation in the recovery loss during the operation of the FWD can be reduced while setting the saturation current and short circuit capacity during the operation of the IGBT to desired values.

In the first to eighth preferred embodiments described above, embodiments to be applied to an RC-IGBT have been described, but they can also be applied to a MOSFET, etc.

In addition, a manufacturing method using an Si substrate has been described as an example of the manufacturing method, but semiconductor substrates made of different materials, such as silicon carbide (SiC), can also be used.

In FIGS. 2, etc., stripe-shaped cells each having the stripe-shaped embedded gate electrode 8 having a trench structure are illustrated, but the present disclosure can also be applied to a cell called a mesh type that extends vertically and horizontally, and also to a cell structure called a planar type that has a planar gate.

<Other Configuration Examples of RC-IGBT>

Figure 32:
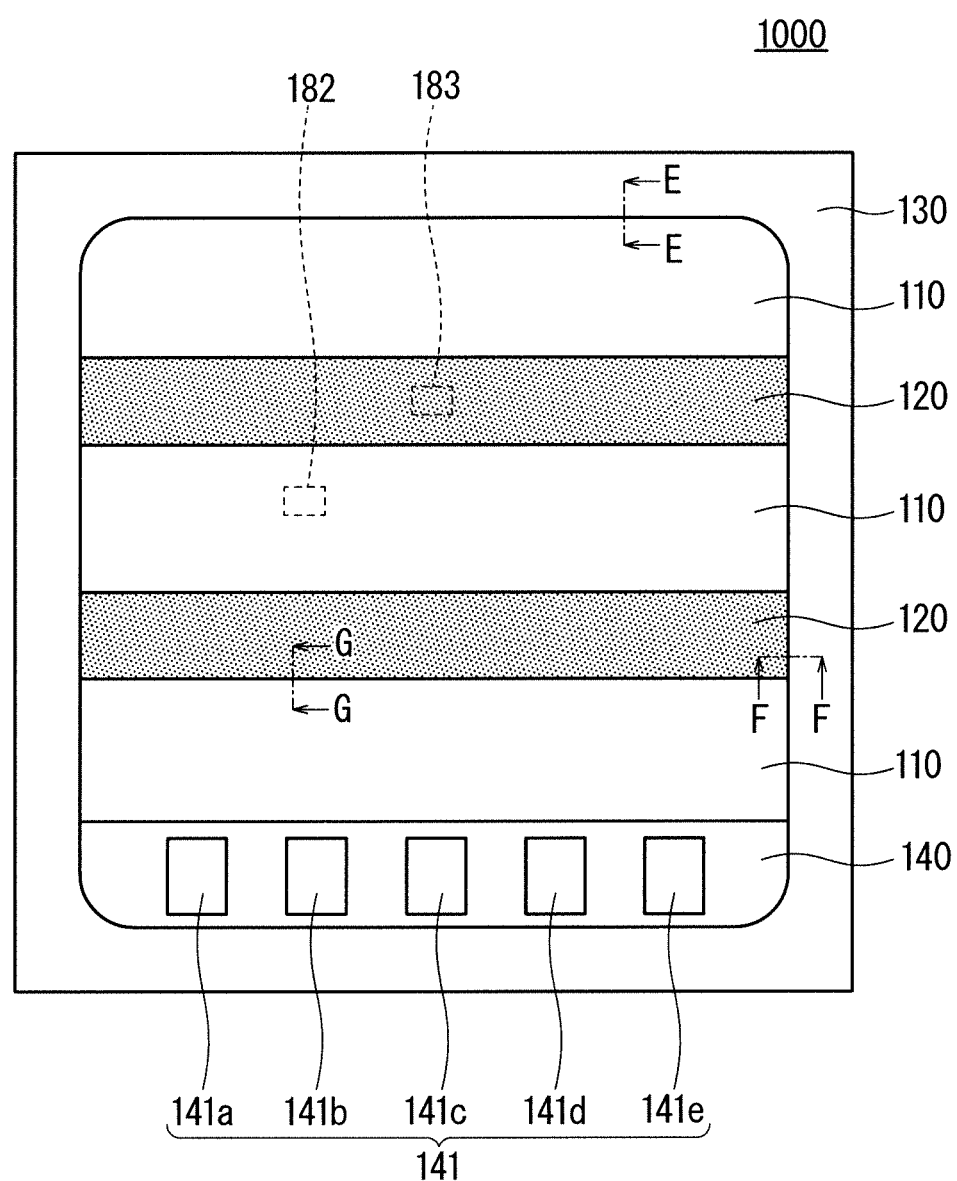
FIGS. 32 and 33 are each a plan view illustrating another configuration of an RC-IGBT.
Figure 33:
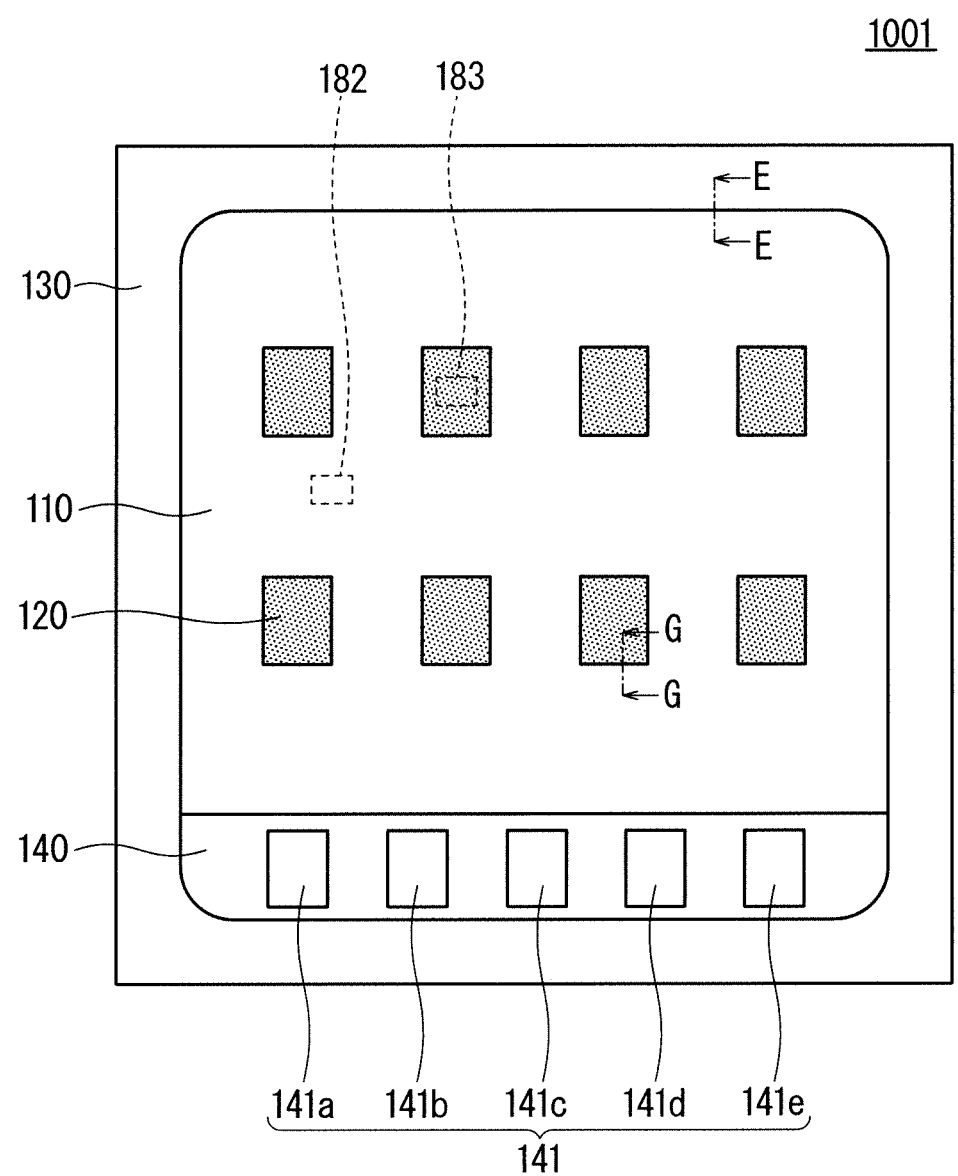

Hereinafter, other configuration examples of the RC-IGBT will be illustrated. FIG. 32 is a plan view illustrating a semiconductor device 1000 that is an RC-IGBT. FIG. 33 is a plan view illustrating a semiconductor device 1001 that is an RC-IGBT. The semiconductor device 1000 illustrated in FIG. 32 is provided with IGBT regions 110 and diode regions 120 that are located side by side in a stripe shape, which may be simply called a "stripe type". The semiconductor device 1001 illustrated in FIG. 33 is provided with a plurality of diode regions 120 that are located in the vertical direction and the horizontal direction, and an IGBT region 110 that is located around the diode regions 120, which may be simply called an "island type".

<Overall Planar Structure of Stripe Type>

In FIG. 32, the semiconductor device 1000 is provided with the IGBT regions 110 and the diode regions 120 in one semiconductor device. The IGBT region 110 and the diode region 120 extend from one end side to the other end side of the semiconductor device 1000, and they are provided alternately in a stripe shape in the direction orthogonal to the extending direction of the IGBT region 110 and the diode region 120. FIG. 32 illustrates a configuration in which three IGBT regions 110 and two diode regions 120 are present and every diode region 120 is sandwiched by the IGBT regions 110. However, the numbers of IGBT regions 110 and diode regions 120 are not limited to these, and the number of IGBT regions 110 may be 3 or more or 3 or less, and the number of diode regions 120 may be 2 or more or 2 or less. Alternatively, a configuration in which the locations of the IGBT regions 110 and the diode regions 120 in FIG. 32 are interchanged may be adopted, or a configuration in which every IGBT region 110 is sandwiched by the diode regions 120 may be adopted. Alternatively, a configuration in which each of the IGBT regions 110 and each of the diode regions 120 are provided adjacent to each other may be adopted.

As illustrated in FIG. 32, a pad region 140 is provided adjacent to the IGBT region 110 on the bottom side of the paper. The pad region 140 is a region where control pads 141 for controlling the semiconductor device 1000 are provided. The IGBT regions 110 and the diode regions 120 are collectively called a cell region. A terminal region 130 is provided around a region including the cell region and the pad region 140 in order to maintain the withstand voltage of the semiconductor device 1000. A well-known withstand voltage holding structure appropriately selected can be provided in the terminal region 130. The withstand voltage holding structure may be configured, for example, by providing, on a first main surface side, which is a front surface side, of the semiconductor device 1000, an FLR whose cell region is surrounded by a p-type terminal well layer that is a p-type semiconductor and a VLD whose cell region is surrounded by a p-type well layer with a concentration gradient. The number of p-type terminal well layers each having a ring shape that are used in the FLR and the concentration gradient to be used for the VLD may be appropriately selected depending on the withstand voltage design of the semiconductor device 1000. Alternatively, the p-type terminal well layer may be provided over almost the entire pad region 140, or an IGBT cell and a diode cell may be provided in the pad region 140. The control pads 141 may be, for example, a current sense pad 141a, a Kelvin emitter pad 141b, a gate pad 141c, and temperature sense diode pads 141d, 141e. The current sense pad 141a is a control pad for detecting a current flowing though the cell region of the semiconductor device 1000, which is a control pad electrically connected to an IGBT cell or a diode cell that is a part of the cell region, so that when a current is expected to flow through the cell region of the semiconductor device 1000, one severalth to 1/tens of thousands of the current flowing through the entire cell region flow.

The Kelvin emitter pad 141b and the gate pad 141c are control pads to which a gate drive voltage for on/off control of the semiconductor device 1000 is applied. The Kelvin emitter pad 141b is electrically connected to a p-type base layer of the IGBT cell, and the gate pad 141c is electrically connected to a gate trench electrode of the IGBT cell. The Kelvin emitter pad 141b and the p-type base layer may be electrically connected via a p$^+$-type contact layer. The temperature sense diode pads 141d. 141e are control pads electrically connected to an anode and a cathode of a temperature sense diode provided in the semiconductor device 1000. The temperature of the semiconductor device 1000 is measured by measuring the voltage between the anode and the cathode of the temperature sense diode (not shown) provided in the cell region.

<Overall Planar Structure of Island Type>

In FIG. 33, the semiconductor device 1001 is provided with the IGBT region 110 and the diode regions 120 in one semiconductor device. A plurality of the diode regions 120 are arranged, in plan view, side by side in the respective vertical and horizontal directions in the semiconductor device, in which every diode region 120 is surrounded by the IGBT region 110. That is, the plurality of diode regions 120 are provided in an island shape in the IGBT region 110. FIG. 33 illustrates a configuration in which the diode regions 120 are provided in a matrix form with 4 columns in the left-right direction of the paper and 2 rows in the up-down direction of the paper, but the number and arrangement of the diode regions 120 are not limited to these. The configuration is only required to be such that one or more diode regions 120 are provided in a scattered manner in the IGBT region 110 and every diode region 120 is surrounded by the IGBT region 110.

As illustrated in FIG. 33, a pad region 140 is provided adjacent to the bottom edge of the paper of the IGBT region 110. The pad region 140 is a region where control pads 141 for controlling the semiconductor device 1001 are provided. The IGBT regions 110 and the diode regions 120 are collectively called a cell region. A terminal region 130 is provided around a region including the cell region and the pad region 140 in order to maintain the withstand voltage of the semiconductor device 1001. A well-known withstand voltage holding structure appropriately selected can be provided in the terminal region 130. The withstand voltage holding structure may be configured, for example, by providing, on a first main surface side, which is a front surface side, of the semiconductor device 1001, an FLR whose region including the cell region and the pad region 140 is surrounded by a p-type terminal well layer that is a p-type semiconductor and a VLD whose cell region is surrounded by a p-type well layer with a concentration gradient. The number of p-type terminal well layers each having a ring shape that are used in the FLR and the concentration gradient to be used for the VLD may be appropriately selected depending on the withstand voltage design of the semiconductor device 1001. Alternatively, the p-type terminal well layer may be provided over almost the entire pad region 140, or an IGBT cell and a diode cell may be provided in the pad region 140.

The control pads 141 may be, for example, a current sense pad 141a, a Kelvin emitter pad 141b, a gate pad 141c, and temperature sense diode pads 141d, 141e. The current sense pad 141a is a control pad for detecting a current flowing though the cell region of the semiconductor device 1001, which is a control pad electrically connected to an IGBT cell or a diode cell that is a part of the cell region, so that when a current is expected to flow through the cell region of the semiconductor device 1001, one severalth to 1/tens of thousands of the current flowing through the entire cell region flow.

The Kelvin emitter pad 141b and the gate pad 141c are control pads to which a gate drive voltage for on/off control of the semiconductor device 1001 is applied. The Kelvin emitter pad 141b is electrically connected to a p-type base layer and an n$^+$-type source layer of the IGBT cell, and the gate pad 141c is electrically connected to a gate trench electrode of the IGBT cell. The Kelvin emitter pad 141b and the p-type base layer may be electrically connected via a p$^+$-type contact layer. The temperature sense diode pads 141d, 141e are control pads electrically connected to an anode and a cathode of a temperature sense diode provided in the semiconductor device 1001. The temperature of the semiconductor device 1001 is measured by measuring the voltage between the anode and the cathode of the temperature sense diode (not shown) provided in the cell region.

<Partial Planar Configuration>

Figure 34:
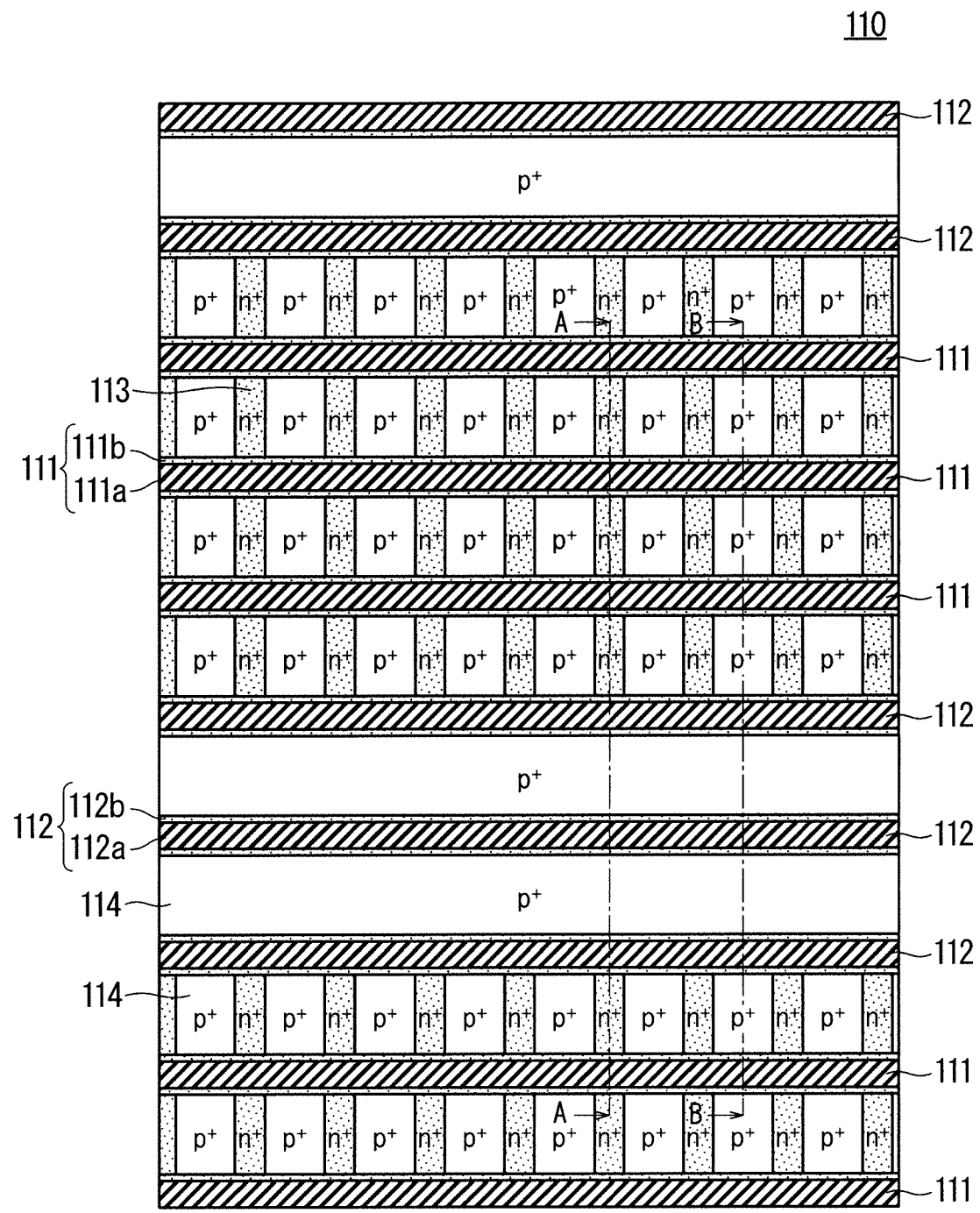
FIG. 34 is a partial plan view illustrating another configuration of an RC-IGBT.

FIG. 34 is a partial plan view illustrating an enlarged region 182, surrounded by a dashed line, of the IGBT region 110 in the semiconductor device 1000 illustrated in FIG. 32 or in the semiconductor device 1001 illustrated in FIG. 33. As illustrated in FIG. 34, active trench gates 111 and dummy trench gates 112 are provided in a stripe shape in the IGBT region 110. In the semiconductor device 1000, the active trench gate 111 and the dummy trench gate 112 extend in the longitudinal direction of the IGBT region 110, and the longitudinal direction of the IGBT region 110 is the longitudinal directions of the active trench gate 111 and the dummy trench gate 112. On the other hand, in the semiconductor device 1001, there is no particular distinction between the longitudinal direction and the lateral direction for the IGBT region 110, but the left-right direction of the paper may be defined as the longitudinal directions of the active trench gate 111 and the dummy trench gate 112, or the up-down direction of the paper may be defined as the longitudinal directions of the active trench gate 111 and the dummy trench gate 112.

The active trench gate 111 is configured by providing a gate trench electrode 111a in a trench formed in the semiconductor substrate via a gate trench insulating film 111b. The dummy trench gate 112 is configured by providing a dummy trench electrode 112a in a trench formed in the semiconductor substrate via a dummy trench insulating film 112b. The gate trench electrode 111a of the active trench gate 111 is electrically connected to the gate pad 141c (FIGS. 32, 33). The dummy trench electrode 112a of the dummy trench gate 112 is electrically connected to an emitter electrode provided on the first main surface of the semiconductor device 1000 or the semiconductor device 1001.

An n$^+$-type source layer 113 is provided in contact with the gate trench insulating film 111b on both sides, in the width direction, of the active trench gate 111. The n$^+$-type source layer 113 is a semiconductor layer having, for example, arsenic (As) or phosphorus (P) as n-type impurities, and the concentration of the n-type impurities is $1.0 \times 10^{17}/cm^3$ to $1.0 \times 10^{20}/cm^3$. The n$^+$-type source layers 113 are provided alternately with p$^+$-type contact layers 114 along the extending direction of the active trench gate 111. The p$^+$-type contact layer 114 is also provided between two adjacent dummy trench gates 112. The p$^+$-type contact layer 114 is a semiconductor layer having, for example, boron (B) or aluminum (Al) as p-type impurities, and the concentration of the p-type impurities is $1.0 \times 10^{15}/cm^3$ to $1.0 \times 10^{20}/cm^3$.

The IGBT region 110 of the semiconductor device 1000 or the semiconductor device 1001 has a configuration in which: three active trench gates 111 are lined up; next to them, three dummy trench gates 112 are lined up; and next to them, three active trench gates 111 are lined up, as illustrated in FIG. 34. The IGBT region 110 has a configuration in which a set of the active trench gates 111 and a set of the dummy trench gates 112 are alternately lined up in this way. In FIG. 34, the number of active trench gates 111 included in one set of the active trench gates 111 is set to 3, but it only has to be 1 or more. The number of dummy trench gates 112 included in one set of the dummy trench gates 112 may be 1 or more, or it may be even zero. That is, all of the trenches provided in the IGBT region 110 may be the active trench gates 111.

<Partial Cross-Sectional Structure>

Figure 35:
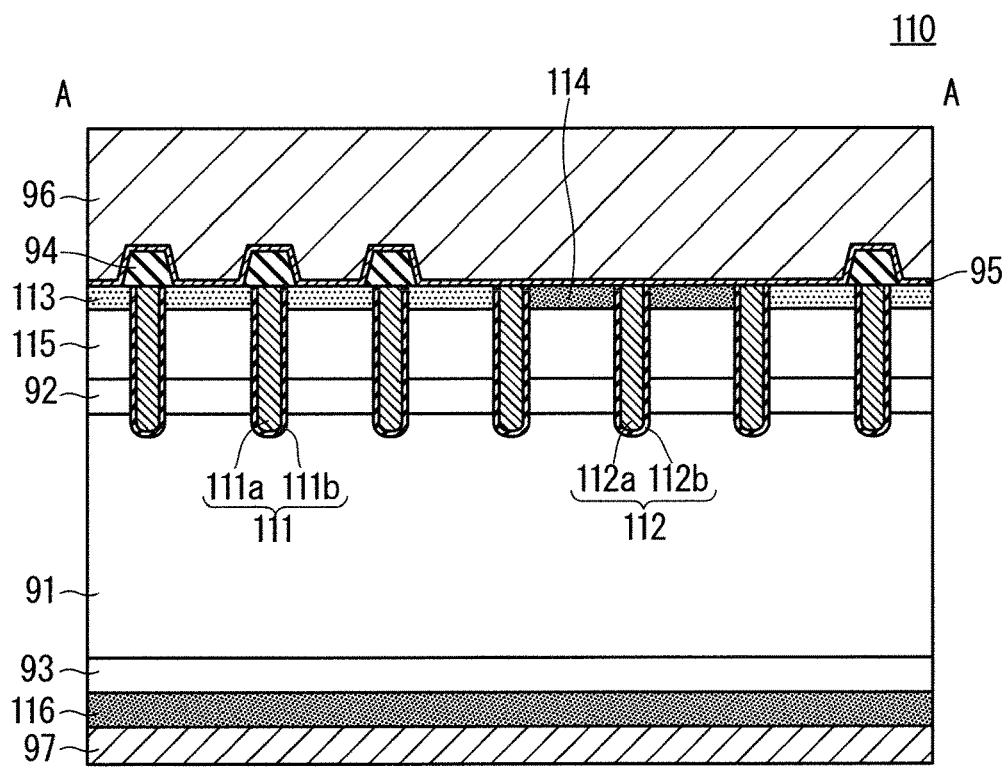
FIGS. 35 and 36 are each a partial cross-sectional view illustrating another configuration of an RC-IGBT.

FIG. 35 is a cross-sectional view taken along the A-A line in FIG. 34 and viewed from the direction indicated by the arrows. As illustrated in FIG. 35, the semiconductor device 1000 or the semiconductor device 1001 has an n⁻-type drift layer 91 made of a semiconductor substrate. The n⁻-type drift layer 91 is a semiconductor layer having, for example, arsenic (As) or phosphorus (P) as n-type impurities, and the concentration of the n-type impurities is $1.0 \times 10^{12}/cm^3$ to $1.0 \times 10^{15}/cm^3$. In FIG. 35, the semiconductor substrate ranges from the n⁺-type source layer 113 and the p⁺-type contact layer 114 to a p-type collector layer 116 in the IGBT region 110.

In FIG. 35, the top edges of the paper of the n⁺-type source layer 113 and the p⁺-type contact layer 114 in the IGBT region 110 are called the first main surface of the semiconductor substrate, and the bottom edge of the paper of the p-type collector layer 116 is called the second main surface of the semiconductor substrate.

The first main surface of the semiconductor substrate is the main surface, on the front surface side, of the semiconductor device 1000 or the semiconductor device 1001, and the second main surface of the semiconductor substrate is the main surface, on the back surface side, of the semiconductor device 1000 or the semiconductor device 1001. The semiconductor device 1000 or the semiconductor device 1001 has the n⁻-type drift layer 91 between the first main surface and the second main surface facing the first main surface in the IGBT region 110 that is the cell region.

In the IGBT region 110, an n-type carrier storage layer 92 having a higher concentration of n-type impurities than the n⁻-type drift layer 91 is provided on the first main surface side of the n⁻-type drift layer 91, as illustrated in FIG. 35. The n-type carrier storage layer 92 is a semiconductor layer having, for example, arsenic (As) or phosphorus (P) as n-type impurities, and the concentration of the n-type impurities is $1.0 \times 10^{13}/cm^3$ to $1.0 \times 10^{17}/cm^3$. Alternatively, the semiconductor device 1000 and the semiconductor device 1001 may have a configuration in which instead of the n-type carrier storage layer 92, the n⁻-type drift layer 91 is provided also in a region where the n-type carrier storage layer 92 is to be provided. By providing the n-type carrier storage layer 92, a power loss, possibly occurring when a current flows through the IGBT region 110, can be reduced. The n-type carrier storage layer 92 and the n⁻-type drift layer 91 may be collectively called a drift layer.

The n-type carrier storage layer 92 is formed by ion-implanting n-type impurities into the semiconductor substrate constituting the n⁻-type drift layer 91 and then by diffusing the implanted n-type impurities into the semiconductor substrate that is the if n⁻-type drift layer 91 with annealing.

A p-type base layer 115 is provided on the first main surface side of the n-type carrier storage layer 92. The p-type base layer 115 is a semiconductor layer having, for example, boron (B) or aluminum (Al) as p-type impurities, and the concentration of the p-type impurities is $1.0 \times 10^{12}/cm^3$ to $1.0 \times 10^{19}/cm^3$. The p-type base layer 115 is in contact with the gate trench insulating film 111b of the active trench gate 111. The n⁺-type source layer 113 is provided in contact with the gate trench insulating film 111b of the active trench gate 111 on the first main surface side of the p-type base layer 115, and the p⁺-type contact layer 114 is provided in the remaining region. The n⁺-type source layer 113 and the p⁺-type contact layer 114 constitute the first main surface of the semiconductor substrate. The p⁺-type contact layer 114 is a region having a higher concentration of p-type impurities than the p-type base layer 115, and when it is necessary to distinguish the p⁺-type contact layer 114 and the p-type base layer 115, each of them may be referred to individually. Otherwise, the p⁺-type contact layer 114 and the p-type base layer 115 may be collectively called a p-type base layer.

In addition, in the semiconductor device 1000 or the semiconductor device 1001, an n-type buffer layer 93 having a higher concentration of n-type impurities than the n⁻-type drift layer 91 is provided on the second main surface side of the n⁻-type drift layer 91. The n-type buffer layer 93 is provided to suppress, during the off-state of the semiconductor device 1000 or the semiconductor device 1001, a depletion layer, extending from the p-type base layer 115 toward the second main surface, from punching through. The n-type buffer layer 93 may be formed by implanting, for example, phosphorus (P) or protons (H⁺), or by implanting both phosphorus (P) and protons (H⁺). The concentration of n-type impurities in the n-type buffer layer 93 is $1.0 \times 10^{12}/cm^3$ to $1.0 \times 10^{18}/cm^3$.

Alternatively, the semiconductor device 1000 or the semiconductor device 1001 may have a configuration in which instead of the n-type buffer layer 93, the n⁻-type drift layer 91 is provided also in a region where the n-type buffer layer 93 is to be provided. The n-type buffer layer 93 and the n⁻-type drift layer 91 may be collectively called a drift layer.

In the semiconductor device 1000 or the semiconductor device 1001, the p-type collector layer 116 is provided on the second main surface side of the n-type buffer layer 93. That is, the p-type collector layer 116 is provided between the n⁻-type drift layer 91 and the second main surface. The p-type collector layer 116 is a semiconductor layer having, for example, boron (B) or aluminum (Al) as p-type impurities, and the concentration of the p-type impurities is $1.0 \times 10^{16}/cm^3$ to $1.0 \times 10^{20}/cm^3$. The p-type collector layer 116 constitutes the second main surface of the semiconductor substrate. The p-type collector layer 116 is provided not only in the IGBT region 110 but also in the terminal region 130 (not shown), and a portion, provided in the terminal region 130, of the p-type collector layer 116 constitutes a p-type terminal collector layer 116a. Alternatively, the p-type collector layer 116 may be provided such that a part of it protrudes from the IGBT region 110 to the diode region 120.

In the IGBT region 110, trenches, each of which penetrates the p-type base layer 115 from the first main surface of the semiconductor substrate and reaches the n⁻-type drift layer 91, are formed as illustrated in FIG. 35. The active trench gate 111 is configured by providing the gate trench electrode 111a in the trench via the gate trench insulating film 111b. The gate trench electrode 111a faces the n⁻-type drift layer 91 via the gate trench insulating film 111b. In addition, the dummy trench gate 112 is configured by providing the dummy trench electrode 112a in the trench via the dummy trench insulating film 112b. The dummy trench electrode 112a faces the n⁻-type drift layer 91 via the dummy trench insulating film 112b. The gate trench insulating film 111b of the active trench gate 111 is in contact with the p-type base layer 115 and the n⁺-type source layer 113. When a gate drive voltage is applied to the gate trench electrode 111a, a channel is formed in the p-type base layer 115 in contact with the gate trench insulating film 111b of the active trench gate 111.

As illustrated in FIG. 35, an interlayer insulating film 94 is provided on the gate trench electrode 111a of the active trench gate 111. A barrier metal 95 is formed on a region of the first main surface of the semiconductor substrate, where the interlayer insulating film 94 is not provided, and on the interlayer insulating film 94. The barrier metal 95 may be a conductor containing, for example, titanium (Ti), may be, for example, titanium nitride, or may be TiSi in which titanium and silicon (Si) are alloyed. As illustrated in FIG. 35, the barrier metal 95 is in ohmic contact with the $n^+$-type source layer 113, the $p^+$-type contact layer 114, and the dummy trench electrode 112a, so that it is electrically connected to the $n^+$-type source layer 113, the $p^+$-type contact layer 114, and the dummy trench electrode 112a. An emitter electrode 96 is provided on the barrier metal 95. The emitter electrode 96 may be formed of, for example, an aluminum alloy such as an aluminum silicon alloy (Al—Si based alloy), or may be an electrode made of multiple layers of metal films obtained by forming a plating film on the electrode formed of the aluminum alloy by electroless plating or electrolytic plating. The plating film formed by electroless plating or electrolytic plating may be, for example, a nickel (Ni) plating film. When there is a fine region, such as one between the adjacent interlayer insulating films 94, where good embedding cannot be obtained with the emitter electrode 96, it may be configured such that tungsten (W) having a better embedding property than the emitter electrode 96 is arranged in the fine region and the emitter electrode 96 is provided on the tungsten. Alternatively, the emitter electrode 96 may be provided on the $n^+$-type source layer 113, the $p^+$-type contact layer 114, and the dummy trench electrode 112a without providing the barrier metal 95. Alternatively, the barrier metal 95 may be provided only on the n-type semiconductor layer such as the $n^+$-type source layer 113. The barrier metal 95 and the emitter electrode 86 may be collectively called an emitter electrode. Although FIG. 35 illustrates a view in which the interlayer insulating film 94 is not provided on the dummy trench electrode 112a of the dummy trench gate 112, the interlayer insulating film 94 may be formed on the dummy trench electrode 112a of the dummy trench gate 112. When the interlayer insulating film 94 is formed on the dummy trench electrode 112a of the dummy trench gate 112, the emitter electrode 96 and the dummy trench electrode 112a may be electrically connected in another cross section.

A collector electrode 97 is provided on the second main surface side of the p-type collector layer 116. The collector electrode 97 may be formed of an aluminum alloy or an aluminum alloy and a plating film, similarly to the emitter electrode 96. Alternatively, the collector electrode 97 may have a different configuration from the emitter electrode 96. The collector electrode 97 is in ohmic contact with the p-type collector layer 116, so that it is electrically connected to the p-type collector layer 116.

Figure 36:
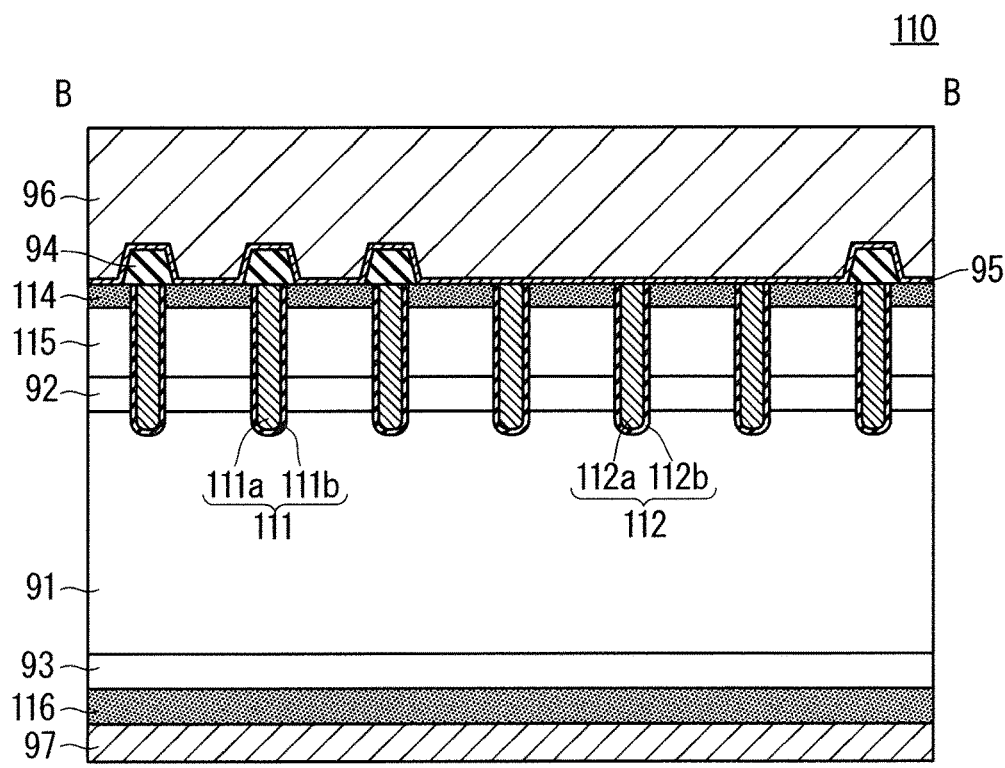

FIG. 36 is a cross-sectional view taken along the B-B line in FIG. 34 and viewed from the direction indicated by the arrows. The cross-sectional structure of the IGBT region 110 illustrated in FIG. 36 is a cross-sectional structure along the arrangement direction of the $p^+$-type contact layer 114. It differs from FIG. 35 in that the $p^+$-type contact layer 114 is provided on the entire first main surface side of the p-type base layer 115 and the $n^+$-type source layer 113 is not seen. That is, the $n^+$-type source layer 113 is selectively provided on the first main surface side of the p-type base layer, as illustrated in FIG. 34. The p-type base layer referred to here means the p-type base layer that the p-type base layer 115 and the $p^+$-type contact layer 114 are collectively called.

<Structure of Diode Region>
<Partial Planar Configuration>

Figure 37:
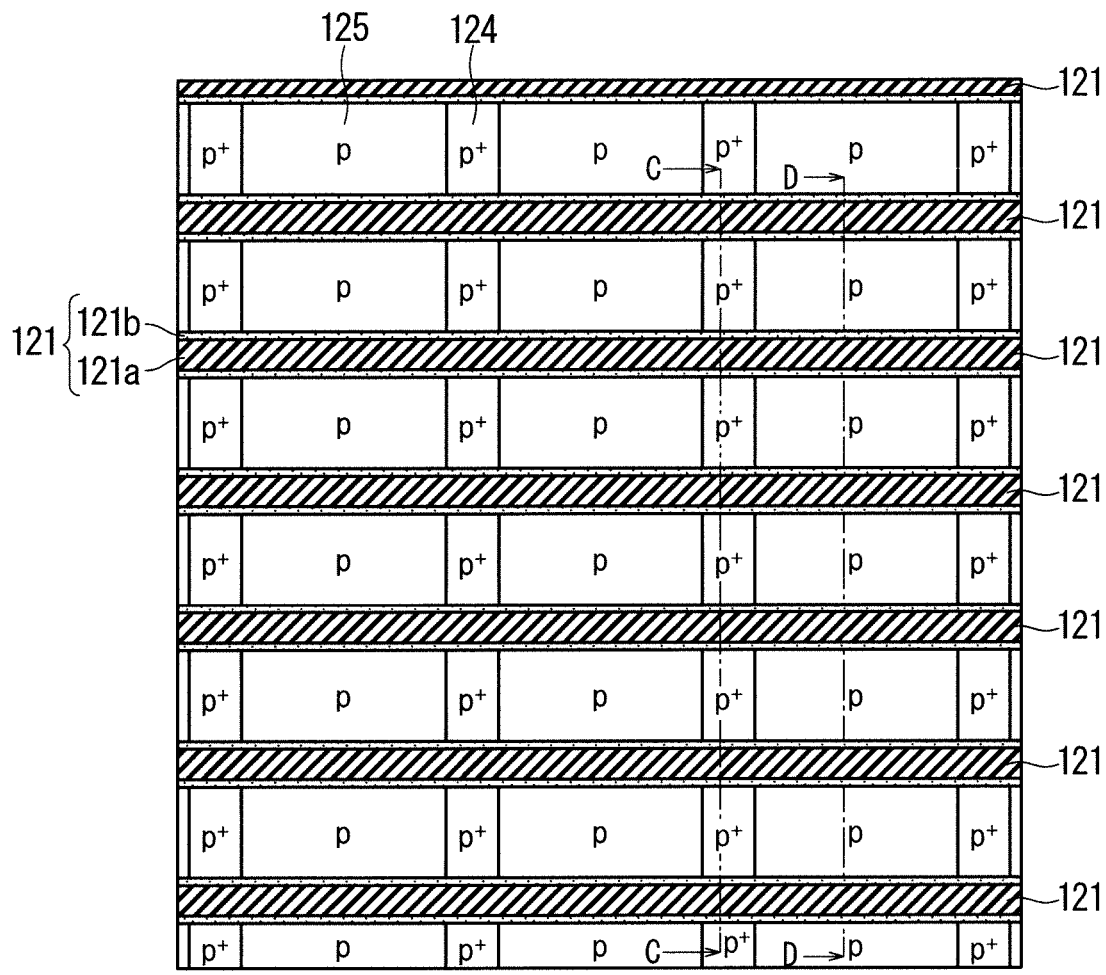
FIG. 37 is a partial plan view illustrating another configuration of an RC-IGBT.

FIG. 37 is an enlarged partial plan view of a region 183, surrounded by the dashed line, of the diode region 120 in the semiconductor device 1000 illustrated in FIG. 32 or the semiconductor device 1001 illustrated in FIG. 33. In the diode region 120, diode trench gates 121 extend from one end side, which is the cell region, of the diode region 120 toward the other end side that faces the one end side along the first main surface of the semiconductor device 1000 or the semiconductor device 1001, as illustrated in FIG. 37. The diode trench gate 121 is configured by providing a diode trench electrode 121a in the trench formed in the semiconductor substrate in the diode region 120 via a diode trench insulating film 121b. The diode trench electrode 121a faces the $n^-$-type drift layer 91 via the diode trench insulating film 121b. A $p^+$-type contact layer 124 and a p-type anode layer 125 are provided between two adjacent diode trench gates 121.

The $p^+$-type contact layer 124 is a semiconductor layer having, for example, boron (B) or aluminum (Al) as p-type impurities, and the concentration of the p-type impurities is $1.0 \times 10^{15}/\text{cm}^3$ to $1.0 \times 10^{20}/\text{cm}^3$. The p-type anode layer 125 is a semiconductor layer having, for example, boron or aluminum as p-type impurities, and the concentration of the p-type impurities is $1.0 \times 10^{12}/\text{cm}^3$ to $1.0 \times 10^{19}/\text{cm}^3$. The $p^+$-type contact layers 124 and the p-type anode layers 125 are alternately provided in the longitudinal direction of the diode trench gate 121.

<Partial Cross-Sectional Structure>

Figure 38:
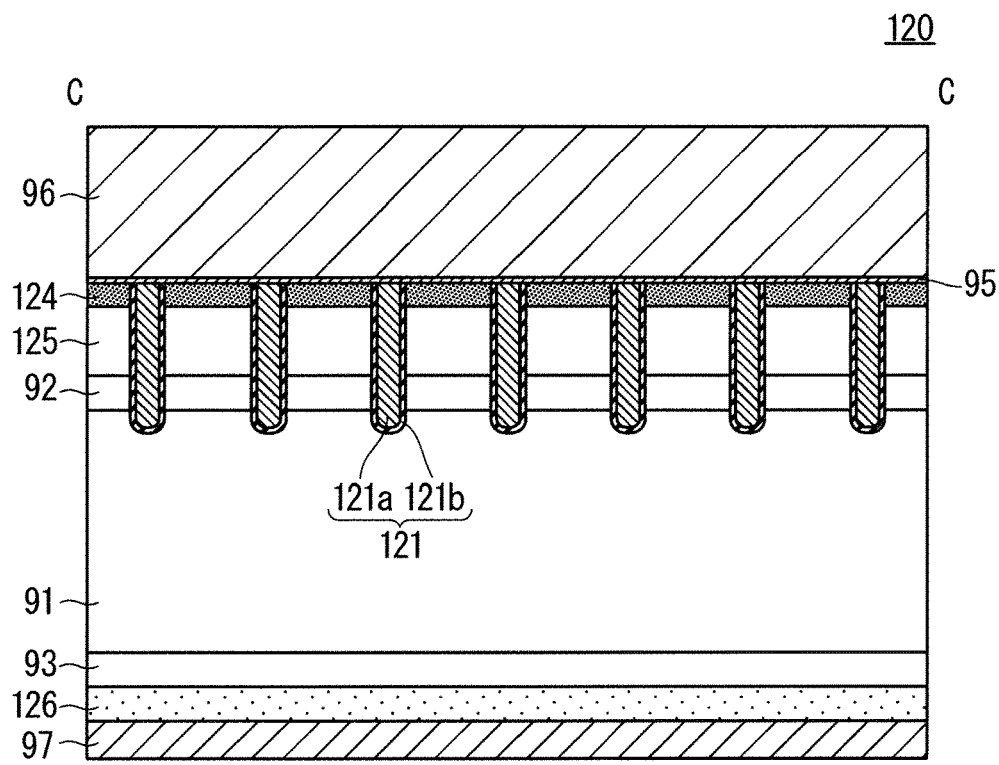
FIGS. 38 to 42 are each a partial cross-sectional view illustrating another configuration of an RC-IGBT.

FIG. 38 is a cross-sectional view taken along the C-C line in FIG. 37 and viewed from the direction indicated by the arrows. As illustrated in FIG. 38, the semiconductor device 1000 or the semiconductor device 1001 has an $n^-$-type drift layer 1 made of the semiconductor substrate even in the diode region 120, similarly to the IGBT region 110. The $n^-$-type drift layer 1 in the diode region 120 and the $n^-$-type drift layer 1 in the IGBT region 110 are continuously and integrally formed, and are formed of the same semiconductor substrate. In FIG. 38, the semiconductor substrate ranges from the $p^+$-type contact layer 124 to an $n^+$-type cathode layer 126. In FIG. 38, the top edge of the paper of the $p^+$-type contact layer 124 is called the first main surface of the semiconductor substrate, and the bottom edge of the paper of the $n^+$-type cathode layer 126 is called the second main surface of the semiconductor substrate. The first main surface in the diode region 120 and the first main surface in the IGBT region 110 are the same surface, and the second main surface in the diode region 120 and the second main surface in the IGBT region 110 are the same surface.

Also, in the diode region 120, the n-type carrier storage layer 92 is provided on the first main surface side of the $n^-$-type drift layer 91, and the n-type buffer layer 93 is provided on the second main surface side of the $n^-$-type drift layer 91, similarly to the IGBT region 110, as illustrated in FIG. 38. The n-type carrier storage layer 92 and the n-type buffer layer 93 provided in the diode region 120 have the same configurations as those of the n-type carrier storage layer 92 and the n-type buffer layer 93 provided in the IGBT region 110, respectively. The n-type carrier storage layer 92 is not necessary required to be provided in the IGBT region 110 and the diode region 120. Even if the n-type carrier storage layer 92 is provided in the IGBT region 110, the n-type carrier storage layer 92 may not be provided in the diode region 120. Similarly to the IGBT region 110, the n⁻-type drift layer 91, the n-type carrier storage layer 92, and the n-type buffer layer 93 may be collectively called a drift layer.

The p-type anode layer 125 is provided on the first main surface side of the n-type carrier storage layer 92. The p-type anode layer 125 is provided between the n⁻-type drift layer 91 and the first main surface. The p-type anode layer 125 and the p-type base layer 115 in the IGBT region 110 may be formed simultaneously by setting the concentrations of p-type impurities in the two layers to be equal to each other. Alternatively, it may be configured such that the amount of holes to be implanted, during the operation of the diode, into the diode region 120 is reduced by setting the concentration of p-type impurities in the p-type anode layer 125 to be lower than the concentration of p-type impurities in the p-type base layer 115 in the IGBT region 110. By reducing the amount of holes to be implanted during the operation of the diode, the recovery loss during the operation of the diode can be reduced.

A p⁺-type contact layer 124 is provided on the first main surface side of the p-type anode layer 125. The concentration of p-type impurities in the p⁺-type contact layer 124 may be set to be equal to or different from the concentration of p-type impurities in the p⁺-type contact layer 114 in the IGBT region 110. The p⁺-type contact layer 124 constitutes the first main surface of the semiconductor substrate. The p⁺-type contact layer 124 is a region having a higher concentration of p-type impurities than the p-type anode layer 125, and when it is necessary to distinguish the p⁺-type contact layer 124 and the p-type anode layer 125, each of them may be referred to individually. Otherwise, the p⁺-type contact layer 124 and the p-type anode layer 125 may be collectively called a p-type anode layer.

In the diode region 120, the n⁺-type cathode layer 126 is provided on the second main surface side of the n-type buffer layer 93, The n⁺-type cathode layer 126 is provided between the n⁻-type drift layer 91 and the second main surface. The n⁺-type cathode layer 126 is a semiconductor layer having, for example, arsenic or phosphorus as n-type impurities, and the concentration of the n-type impurities is $1.0×10^{16}/cm^3$ to $1.0×10^{21}/cm^3$. As illustrated in FIG. 38, the n⁺-type cathode layer 126 is provided in a part or all of the diode region 120. The n⁺-type cathode layer 126 constitutes the second main surface of the semiconductor substrate. Although not illustrated, a part of a region where the n⁺-type cathode layer 126 has been formed as described above may be changed to a p-type semiconductor by further implanting p-type impurities selectively into the region, whereby a p-type cathode layer can be provided. The diode in which the n⁺-type cathode layers and the p⁺-type cathode layers are alternately arranged along the second main surface of the semiconductor substrate in this way is referred to as an RFC (Relaxed Field of Cathode) diode.

In the diode region 120 of the semiconductor device 1000 or the semiconductor device 1001, trenches, each of which penetrates the p-type anode layer 125 from the first main surface of the semiconductor substrate and reaches the n⁻-type drift layer 91, are formed as illustrated in FIG. 38. The diode trench gate 121 is configured by providing the diode trench electrode 121a in the trench in the diode region 120 via the diode trench insulating film 121b. The diode trench electrode 121a faces the n⁻-type drift layer 91 via the diode trench insulating film 121b.

As illustrated in FIG. 38, the barrier metal 95 is provided on the diode trench electrode 121a and the p⁺-type contact layer 124. The barrier metal 95 is in ohmic contact with the diode trench electrode 121a and the p⁺-type contact layer 124, so that it is electrically connected to the diode trench electrode and the p⁺-type contact layer 124. The barrier metal 95 may have the same configuration as that of the barrier metal 95 in the IGBT region 110. An emitter electrode 96 is provided on the barrier metal 95. The emitter electrode 96 provided in the diode region 120 is formed continuously with the emitter electrode 96 provided in the IGBT region 110. As in the case of the IGBT region 110, the diode trench electrode 121a and the p⁺-type contact layer 124 may be brought into ohmic contact with the emitter electrode 96 without providing the barrier metal 95. Although FIG. 38 illustrates a view in which the interlayer insulating film 94 is not provided on the diode trench electrode 121a of the diode trench gate 121, the interlayer insulating film 94 may be formed on the diode trench electrode 121a of the diode trench gate 121. When the interlayer insulating film 94 is formed on the diode trench electrode 121a of the diode trench gate 121, the emitter electrode 96 and the diode trench electrode 121a may be electrically connected in another cross section.

The collector electrode 97 is provided on the second main surface side of the n⁺-type cathode layer 126. Similarly to the emitter electrode 96, the collector electrode 97 in the diode region 120 is formed continuously with the collector electrode 97 provided in the IGBT region 110. The collector electrode 97 is in ohmic contact with the n⁺-type cathode layer 126, so that it is electrically connected to the n⁺-type cathode layer 126.

Figure 39:
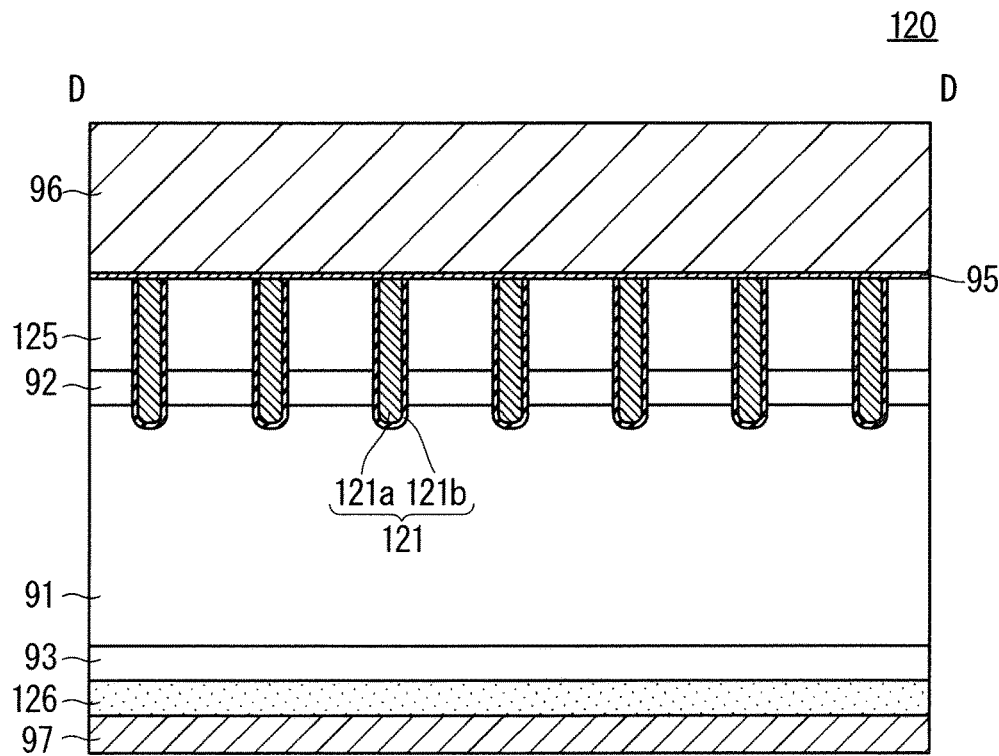

FIG. 39 is a cross-sectional view taken along the D-D line in FIG. 37 and viewed from the direction indicated by the arrows. Since the cross-sectional structure, illustrated in FIG. 39, of the diode region 120 is a cross-sectional structure along the arrangement direction of the p-type anode layers 125, the p⁺-type contact layer 124 is not provided between the p-type anode layer 125 and the barrier metal 95. It differs from FIG. 38 in that the p-type anode layer 125 constitutes the first main surface of the semiconductor substrate. That is, the p⁺-type contact layer 124 is selectively provided on the first main surface side of the p-type anode layer 125, as illustrated in FIG. 37.

Figure 40:
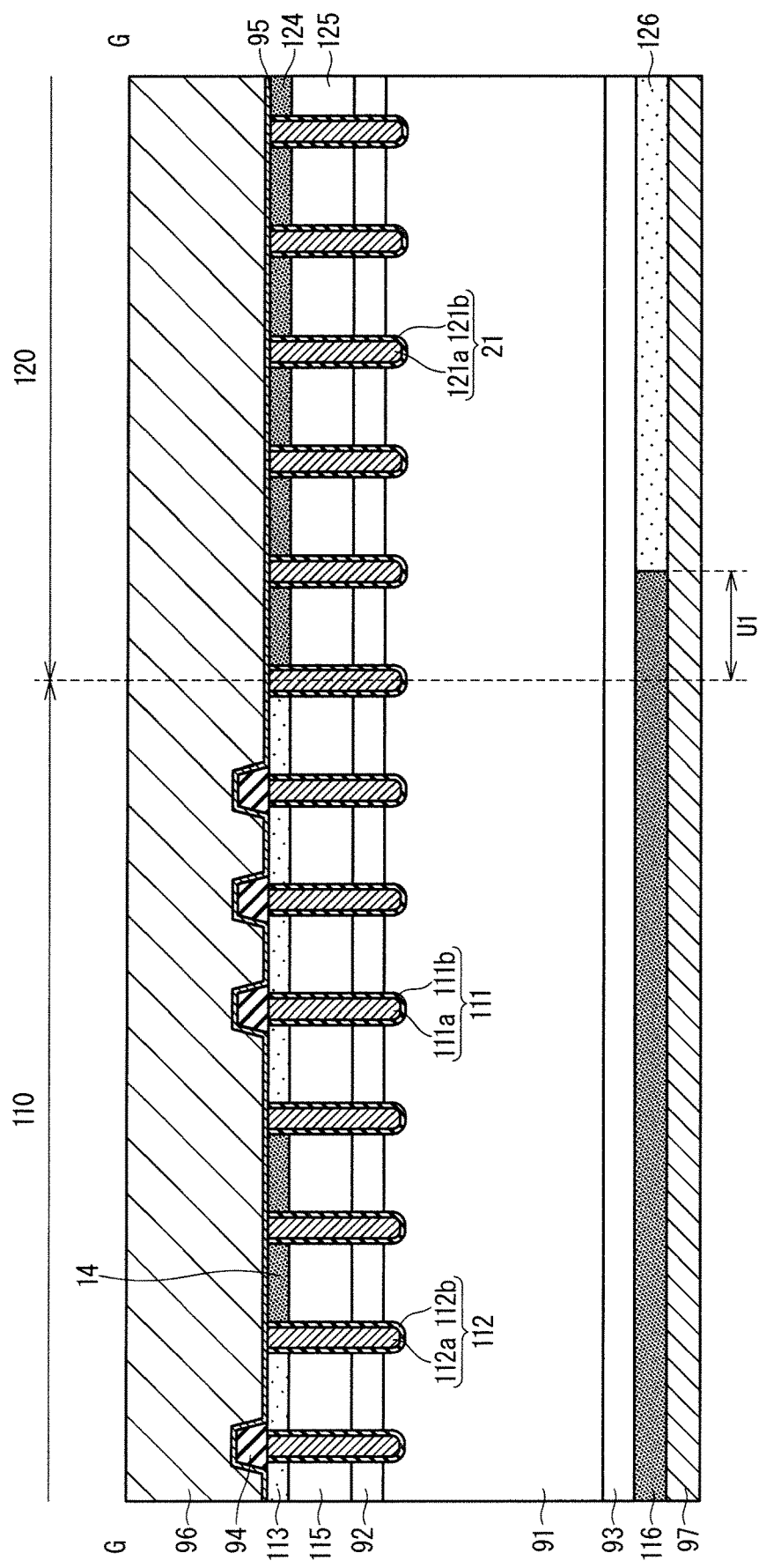

FIG. 40 is a cross-sectional view taken along the G-G line in the semiconductor device 1000 illustrated in FIG. 32 or the semiconductor device 1001 illustrated in FIG. 33, and viewed from the direction indicated by the arrows, in which the structure of the boundary portion between the IGBT region 110 and the diode region 120 is illustrated.

As illustrated in FIG. 40, the p-type collector layer 116 provided on the second main surface side in the IGBT region 110 is provided to protrude from the boundary between the IGBT region 110 and the diode region 120 into the diode region 120 by a distance U1. By providing the p-type collector layer 116 so as to protrude into the diode region 120 in this way, the distance between the n⁺-type cathode layer 126 in the diode region 120 and the active trench gate 111 can be increased. Therefore, even if a gate drive voltage is applied to the active trench gate 111 during the operation of a freewheeling diode, a current can be suppressed from flowing into the n⁺-type cathode layer 126 from a channel formed adjacent to the active trench gate 111 in the IGBT region 110. The distance U1 may be, for example, 100 μm. The distance U1 may be zero or smaller than 100 μm depending on the use of the semiconductor device 1000 or the semiconductor device 1001 that is an RC-IGBT.

<Structure of Terminal Region>

Figure 41:
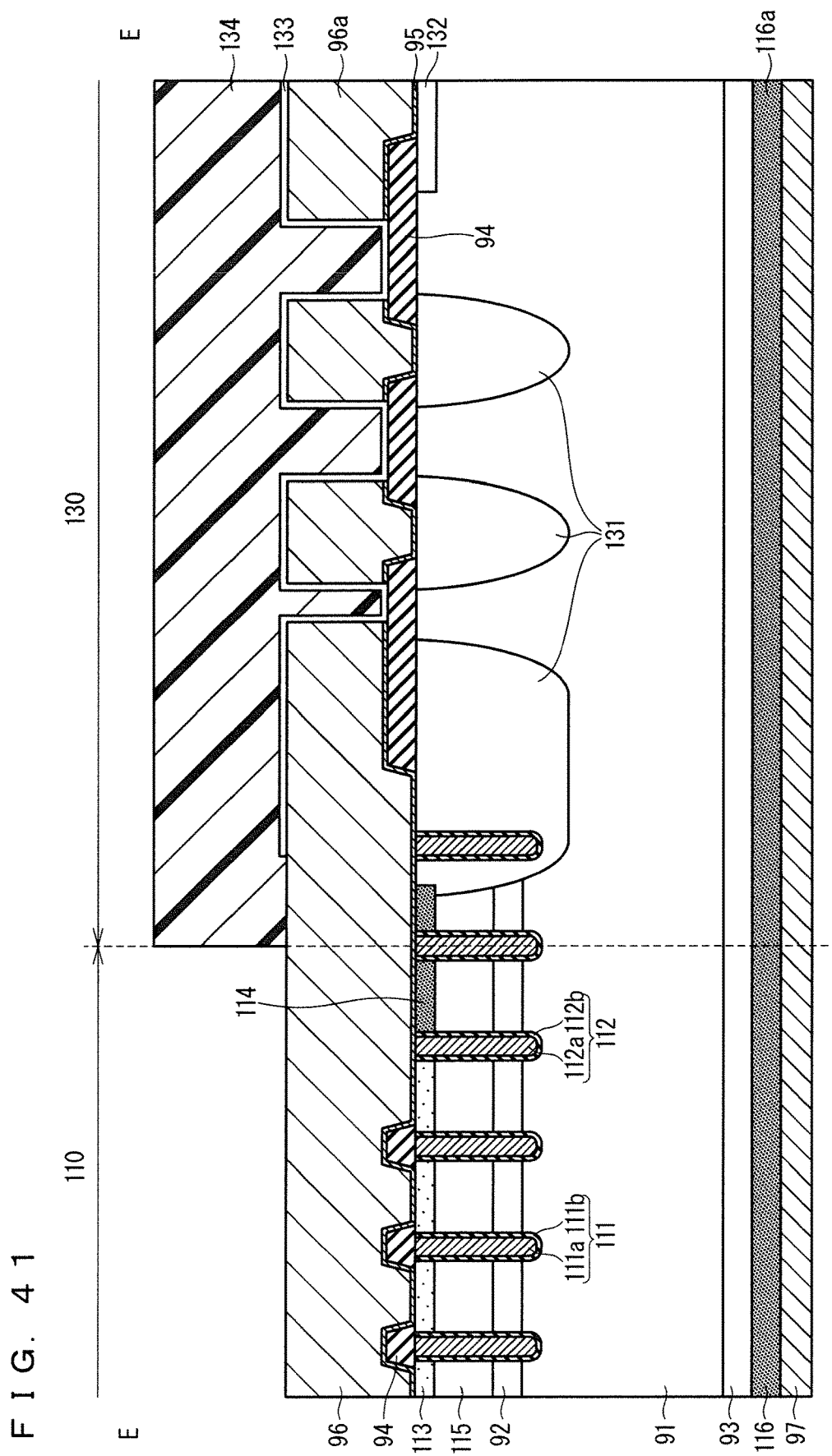

FIG. 41 is a cross-sectional view taken along the E-E line in the semiconductor device 1000 illustrated in FIG. 32 or the semiconductor device 1001 illustrated in FIG. 33, and viewed from the direction indicated by the arrows, in which the configuration of the boundary portion between the IGBT region 110 and the terminal region 130 is illustrated.

As illustrated in FIG. 41, the terminal region 130 of the semiconductor device 1000 or the semiconductor device 1001 has the n⁻-type drift layer 91 between the first main surface and second main surface of the semiconductor substrate. The first and second main surfaces in the terminal region 130 are the same as the first and second main surfaces in each of the IGBT region 110 and the diode region 120. In addition, the n⁻-type drift layer 91 in the terminal region 130 has the same configuration as that of the n⁻-type drift layer 91 in each of the IGBT region 110 and the diode region 120, and is formed continuously and integrally with the layers.

A p-type terminal well layer 131 is provided on the first main surface side of the n⁻-type drift layer 91, that is, provided between the first main surface of the semiconductor substrate and the n⁻-type drift layer 91. The p-type terminal well layer 131 is a semiconductor layer having, for example, boron (B) or aluminum (Al) as p-type impurities, and the concentration of the p-type impurities is $1.0 \times 10^{14}/\text{cm}^3$ to $1.0 \times 10^{19}/\text{cm}^3$. The p-type terminal well layer 131 is provided to surround the cell region including the IGBT region 110 and the diode region 120. The p-type terminal well layer 131 is provided in the form of multiple rings, and the number of p-type terminal well layers 131 provided is appropriately selected depending on the withstand voltage design of the semiconductor device 1000 or the semiconductor device 1001. An n⁺-type channel stopper layer 132 is provided on the further outer edge side of the p-type terminal well layer 131 in order to surround the p-type terminal well layer 131.

The p-type terminal collector layer 116a is provided between the n⁻-type drift layer 91 and the second main surface of the semiconductor substrate. The p-type terminal collector layer 116a is formed continuously and integrally with the p-type collector layer 116 provided in the cell region. Therefore, the p-type collector layer 116 and the p-type terminal collector layer 116a may be collectively called a p-type collector layer 116.

The collector electrode 97 is provided on the second main surface of the semiconductor substrate. The collector electrode 97 is continuously and integrally formed over a region from the cell region including the IGBT region 110 and the diode region 120 to the terminal region 130. On the other hand, on the first main surface of the semiconductor substrate in the terminal region 130, the emitter electrode 96 that is continued from the cell region and a terminal electrode 96a separated from the emitter electrode 96 are provided.

The emitter electrode 96 and the terminal electrode 96a are electrically connected to each other via a semi-insulating film 133. The semi-insulating film 133 may be, for example, a sinSiN (semi-insulating Silicon Nitride) film. The terminal electrode 96a, the p-type terminal well layer 131, and the n⁺-type channel stopper layer 132 are electrically connected via a contact hole formed in the interlayer insulating film 94 provided on the first main surface in the terminal region 130. In addition, the terminal region 130 is provided with a terminal protective film 134 that covers the emitter electrode 96, the terminal electrode 96a, and the semi-insulating film 133. The terminal protective film 134 may be formed of, for example, polyimide.

Figure 42:
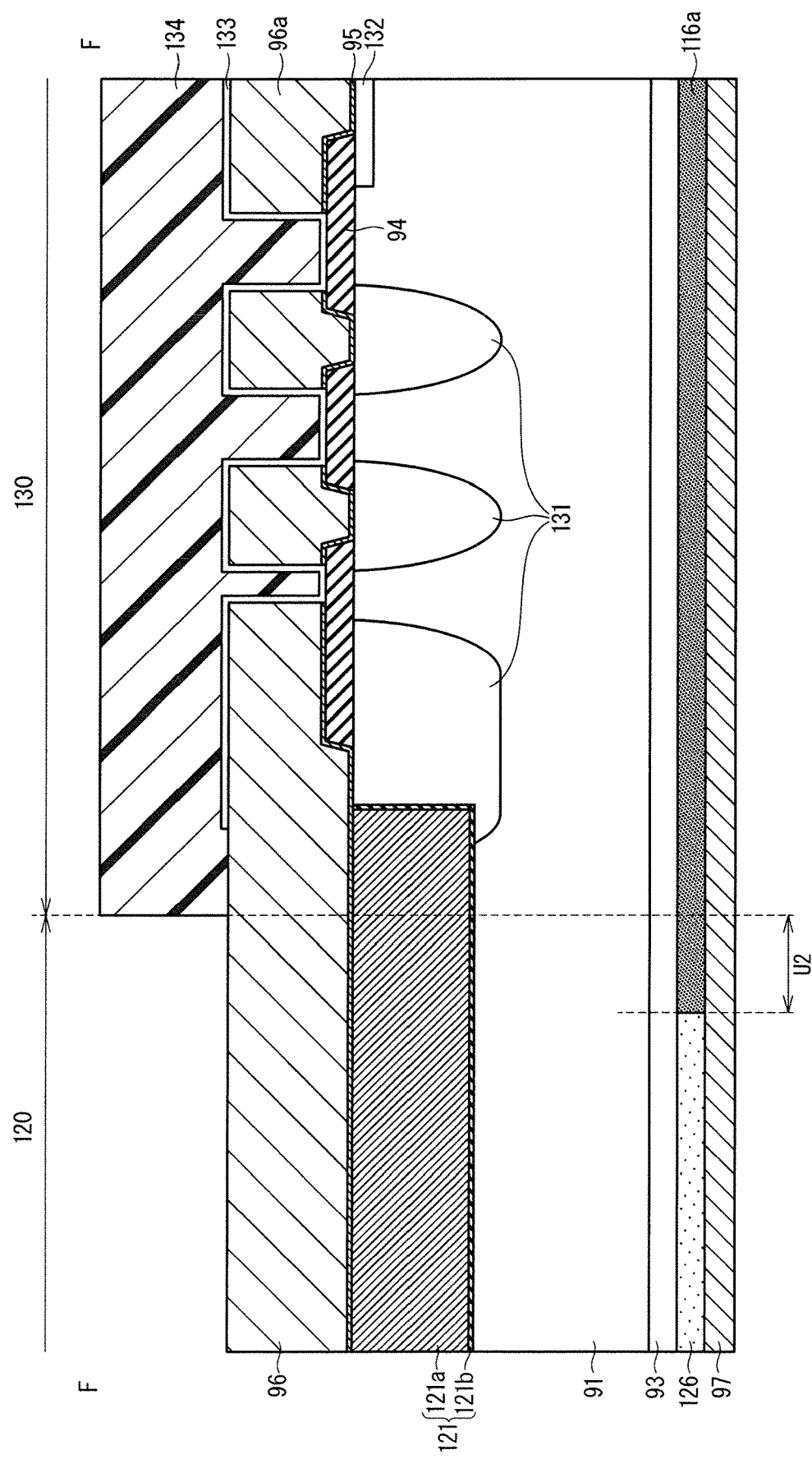

FIG. 42 is a cross-sectional view taken along the line in the semiconductor device 1000 illustrated in FIG. 32 or the semiconductor device 1001 illustrated in FIG. 33, and viewed from the direction indicated by the arrows, in which the configuration of the boundary portion between the IGBT region 110 and the terminal region 130 is illustrated.

As illustrated in FIG. 42, the p-type terminal collector layer 116a is provided such that the end portion on the diode region 120 side protrudes into the diode region 120 by a distance U2. By providing the p-type terminal collector layer 116a so as to protrude into the diode region 120 in this way, the distance between the n⁺-type cathode layer 126 in the diode region 120 and the p-type terminal well layer 131 can be increased. Therefore, the p-type terminal well layer 131 can be suppressed from operating as the anode of the diode. The distance U2 may be, for example, 100 μm.

In the present disclosure, each preferred embodiment can be freely combined or can be appropriately modified or omitted within the scope of the present disclosure.

While the disclosure has been shown and described in detail, the foregoing description is in all aspects illustrative and not restrictive. It is therefore understood that numerous modifications and variations can be devised.

What is claimed is:

1. A semiconductor device in which a transistor and a diode are formed on a common semiconductor substrate, wherein:
    the semiconductor substrate has
    a transistor region where the transistor is formed,
    a diode region where the diode is formed, and
    an outer peripheral region surrounding a cell region including the transistor region and the diode region;
    the transistor region is divided into a plurality of channel regions in each of which a channel is formed and a plurality of non-channel regions in each of which the channel is not formed, by a plurality of gate electrodes each having a stripe shape;
    each of the plurality of channel regions has
    a first semiconductor layer of a first conductivity type provided on a second main surface side of the semiconductor substrate,
    a second semiconductor layer of a second conductivity type provided on
    the first semiconductor layer,
    a third semiconductor layer of the first conductivity type provided on a first main surface side of the semiconductor substrate with respect to the second semiconductor layer,
    a fourth semiconductor layer of the second conductivity type selectively provided on an upper layer part of the third semiconductor layer,
    a fifth semiconductor layer of the first conductivity type selectively provided such that a side surface of the fifth semiconductor layer is in contact with a side surface of the fourth semiconductor layer,
    a first electrode electrically connected to the first semiconductor layer, and
    a second electrode electrically connected to the fourth semiconductor layer and the fifth semiconductor layer;
    among the plurality of non-channel regions, at least one non-channel region has
    the first semiconductor layer,
    the second semiconductor layer,
    the third semiconductor layer,
    the fifth semiconductor layer,
    the first electrode, and
    the second electrode;

the third semiconductor layer and the fifth semiconductor layer in the at least one non-channel region are electrically connected to the second electrode via a contact hole; and the fifth semiconductor layer in the at least one non-channel region is a first non-channel region selectively provided on the upper layer part of the third semiconductor layer so as not to be in contact with an impurity layer of the first conductivity type that is provided in the outer peripheral region and defines a boundary with the cell region.

2. The semiconductor device according to claim 1, wherein:

the plurality of non-channel regions include a second non-channel region;

the second non-channel region has the first semiconductor layer, the second semiconductor layer, the fifth semiconductor layer, the first electrode, and the second electrode;

the third semiconductor layer and the fifth semiconductor layer are electrically connected to the second electrode via the contact hole; and the fifth semiconductor layer is selectively provided on the upper layer part of the third semiconductor layer so as to be in contact with the impurity layer in the outer peripheral region.

3. The semiconductor device according to claim 1, wherein in the first non-channel region, a ratio of an area, in plan view, of the fifth semiconductor layer to a total area, in plan view, of the third semiconductor layer and the fifth semiconductor layer is smaller than a ratio of an area, in plan view, of the third semiconductor layer.

4. The semiconductor device according to claim 1, wherein the fifth semiconductor layer in the first non-channel region is arranged at a position facing, in plan view, the fourth semiconductor layer in the channel region that is separated by the gate electrode.

5. The semiconductor device according to claim 1, wherein:

the plurality of non-channel regions include a second non-channel region;

the second non-channel region has the first semiconductor layer, the second semiconductor layer, the third semiconductor layer, the fifth semiconductor layer, the first electrode, and the second electrode; and the fifth semiconductor layer is provided on an entire surface of the upper layer part of the third semiconductor layer so as to be in contact with the impurity layer in the outer peripheral region, and is electrically connected to the second electrode via the contact hole.

6. The semiconductor device according to claim 1 wherein the first non-channel region is arranged adjacent to the diode region.

7. The semiconductor device according to claim 1, wherein:

the fifth semiconductor layer in the first non-channel region is provided such that, in plan view, an elongated rectangular shape extending in an extending direction of the plurality of gate electrodes, is arranged discontinuously at intervals so as to form a line in a longitudinal direction of the fifth semiconductor layer; and the interval is set to be smaller than a length in the longitudinal direction.

8. The semiconductor device according to claim 1, wherein the fifth semiconductor layer in the first non-channel region is provided such that a shape, in plan view, of the fifth semiconductor layer forms a continuous single line extending in an extending direction of the plurality of gate electrodes.

9. The semiconductor device according to claim 1, wherein in each of the plurality of channel regions and the plurality of non-channel regions, channel regions and non-channel regions are alternately arranged.

10. The semiconductor device according to claim 1, wherein the plurality of channel regions and the plurality of non-channel regions are arranged such that in the transistor region, an arrangement ratio of the plurality of channel regions is smaller than an arrangement ratio of the plurality of non-channel regions.

11. The semiconductor device according to claim 10, wherein among the plurality of gate electrodes, a gate electrode sandwiched by two non-channel regions is connected to a potential of the second electrode.

* * * * *